(12) United States Patent
Lin et al.

(10) Patent No.: US 12,183,579 B2
(45) Date of Patent: Dec. 31, 2024

(54) METHOD FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Kun-Yu Lin, Kaohsiung (TW); Yu-Ling Ko, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 608 days.

(21) Appl. No.: 17/461,191

(22) Filed: Aug. 30, 2021

(65) Prior Publication Data

US 2023/0068794 A1    Mar. 2, 2023

(51) Int. Cl.
*H01L 21/033*    (2006.01)
*H01L 29/66*    (2006.01)
*H10B 10/00*    (2023.01)
*H01L 21/02*    (2006.01)

(52) U.S. Cl.
CPC .... *H01L 21/0337* (2013.01); *H01L 29/66795* (2013.01); *H10B 10/12* (2023.02); *H01L 21/0212* (2013.01)

(58) Field of Classification Search
None
See application file for complete search history.

(56) References Cited

U.S. PATENT DOCUMENTS

2016/0336178 A1* 11/2016 Swaminathan ... C23C 16/45542
2019/0108997 A1* 4/2019 Kihara .............. H01L 21/02219

* cited by examiner

*Primary Examiner* — Roberts P Culbert
(74) *Attorney, Agent, or Firm* — Birch, Stewart, Kolasch & Birch, LLP

(57) ABSTRACT

A method for manufacturing a semiconductor device is provided. The method includes forming a material layer over a semiconductor substrate; forming a plurality of spacer masks over the material layer; patterning the material layer into a plurality of masks below the spacer masks, wherein patterning the material layer comprises an atomic layer etching (ALE) process; and etching the semiconductor substrate through the masks.

20 Claims, 30 Drawing Sheets

METHOD FOR MANUFACTURING SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
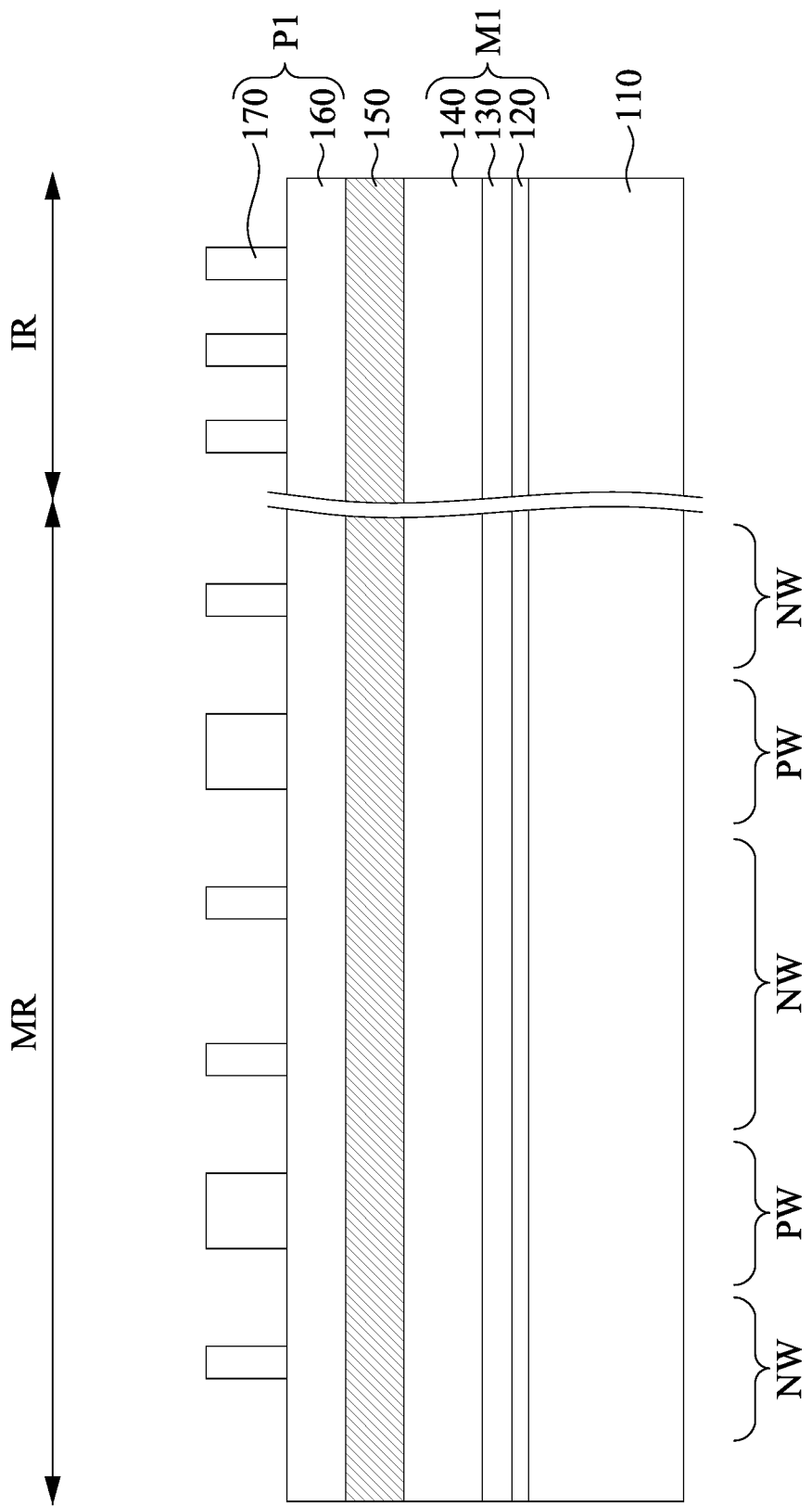
FIGS. 1-18 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The double patterning process may be referred to as a self-aligned double patterning (SADP) process.

FIGS. 1-18 illustrate a method for manufacturing a semiconductor device at various stages in accordance with some embodiments of the present disclosure. It is understood that additional operations may be provided before, during, and after the operations shown by FIGS. 1-18, and some of the operations described below can be replaced or eliminated for additional embodiments of the method. The order of the operations/processes may be interchangeable.

FIG. 1 illustrates a cross-sectional view of a substrate 110, which may be a part of a wafer. The substrate 110 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 110 may include various doped regions (e.g., p-type well regions PW or n-type well regions NW). The doped regions may be doped with p-type dopants, such as phosphorus or arsenic, and/or n-type dopants, such as boron or $BF_2$, depending on design requirements. The substrate 110 may include a memory region MR and a I/O region IR, in which static random access memory (SRAM) cells are formed over the memory region MR, and I/O circuits are formed over the I/O region TR. While the memory region MR is doped to have the p-type well regions PW or n-type well regions NW, the I/O region IR may also be doped to have p-type well regions or n-type well regions (not shown).

In some embodiments, a material layer M1 to be patterned is formed over the substrate 110. The material layer M1 may include multiple layer structures, such as a tri-layer stack, which includes a first layer 120, a second layer 130, and a third layer 140. In some embodiments, the first layer 120, the second layer 130, and the third layer 140 include suitable semiconductor materials and/or different dielectric materials to achieve desired etching selectivity, such as silicon, amorphous silicon, semiconductor oxide (e.g., silicon oxide ($SiO_2$)), semiconductor nitride (e.g., silicon nitride (SiN)), semiconductor oxynitride (e.g., silicon oxynitride (SiON)), and/or semiconductor carbide (e.g., silicon carbide (SiC)), the like, or the combination thereof. In some alternative embodiments, the material layer M1 may include any number of material layers, masking layers, sacrificial layers, resist layers and/or other layers formed upon the substrate 110.

Suitable materials for these layers may be selected, in part, based on etchant selectivity. For example, in the tri-layer stack, the second layer 130 may be made of a material different than that of the first layer 120 and the third layer 140, such that each layer (e.g., the first layer 120 or the second layer 130) can be removed using a corresponding etchant without significantly etching of the underlying layer. In other words, the first layer 120, the second layer 130, and the third layer 140 include materials having different etch rates. In some embodiments, the third layer 140 can serve as an etch mask for patterning the second layer 130; the second layer 130 can serve as an etch mask for patterning the first layer 120 and/or the substrate 110; and the first layer 120 can serve as an etch mask for patterning the substrate 110. For example, in some embodiments, the first layer 120 includes silicon oxide, the second layer 130 includes silicon nitride, and the third layer 140 includes silicon oxide.

In some embodiments, the first layer 120 may be referred to as a pad oxide layer formed using atomic layer deposition (ALD), chemical vapor deposition (CVD), thermal oxidation, the like, or the combination thereof. In some embodiments, the second layer 130 may be referred to as a hard mask layer formed using atomic layer deposition (ALD), chemical vapor deposition (CVD), the like, or the combination thereof. In some embodiments, the third layer 140 may be formed using atomic layer deposition (ALD), chemical vapor deposition (CVD), the like, or the combination thereof.

In some embodiments, a sacrificial layer 150 is formed over the material layer M1. The sacrificial layer 150 includes a different material than the material layer M1, thereby exhibiting different etchant sensitivity. In various embodiments, the sacrificial layer 150 includes a semiconductor material (e.g., amorphous silicon) and/or a dielectric material (e.g., a semiconductor oxide, semiconductor nitride, semiconductor oxynitride), the like, or the combination thereof. In some embodiments where the first layer 120 includes silicon oxide, the second layer 130 includes silicon nitride, and the third layer 140 includes silicon oxide, the sacrificial layer 150 may include amorphous silicon. The sacrificial layer 150 may be formed by suitable deposition process, such as chemical vapor deposition (CVD), plasma-enhanced oxide (PEOX) process, the like, or the combination thereof.

A resist layer P1 is formed and subsequently patterned on the sacrificial layer 150. The resist layer P1 may include plural layers made of suitable material or composition. The exemplary resist layer P1 includes a bottom layer 160 and a top layer 170, each with different or at least independent materials. For example, the bottom layer 160 may include a carbon rich polymer material (e.g., $C_xH_yO_z$), and the top layer 170 may include a carbon rich polymer material (e.g., $C_xH_yO_z$) with a photosensitive component that causes the top layer 170 to undergo a property change when exposed to radiation. This property change can be used to selectively remove exposed (in the case of a positive tone resist) or unexposed (in the case of a negative tone resist) portions of the resist layer P1. It is understood that in other embodiments, the bottom layer 160 may be omitted. In some other embodiments, additional layers may be provided as a part of the resist layer P1. For example, in some other embodiments, the resist layer P1 may be tri-layer resist layer, and a middle layer (not shown) including a silicon rich polymer material (e.g., $SiC_xH_yO_z$) is formed between the bottom layer 160 and the top layer 170.

In some embodiments, the top layer 170 of the resist layer P1 is patterned first. Patterning may be performed using any suitable lithographic technique including photolithography and/or direct-write lithography. An exemplary photolithographic patterning process includes soft baking of the resist layer P1, mask aligning, exposure, post-exposure baking, developing the resist layer P1, rinsing, and drying (e.g., hard baking). An exemplary direct-write patterning process includes scanning the surface of the resist layer P1 with an e-beam or other energy source while varying the intensity of the energy source in order to vary the dosage received by various regions of the resist layer P1.

Figure 2A:
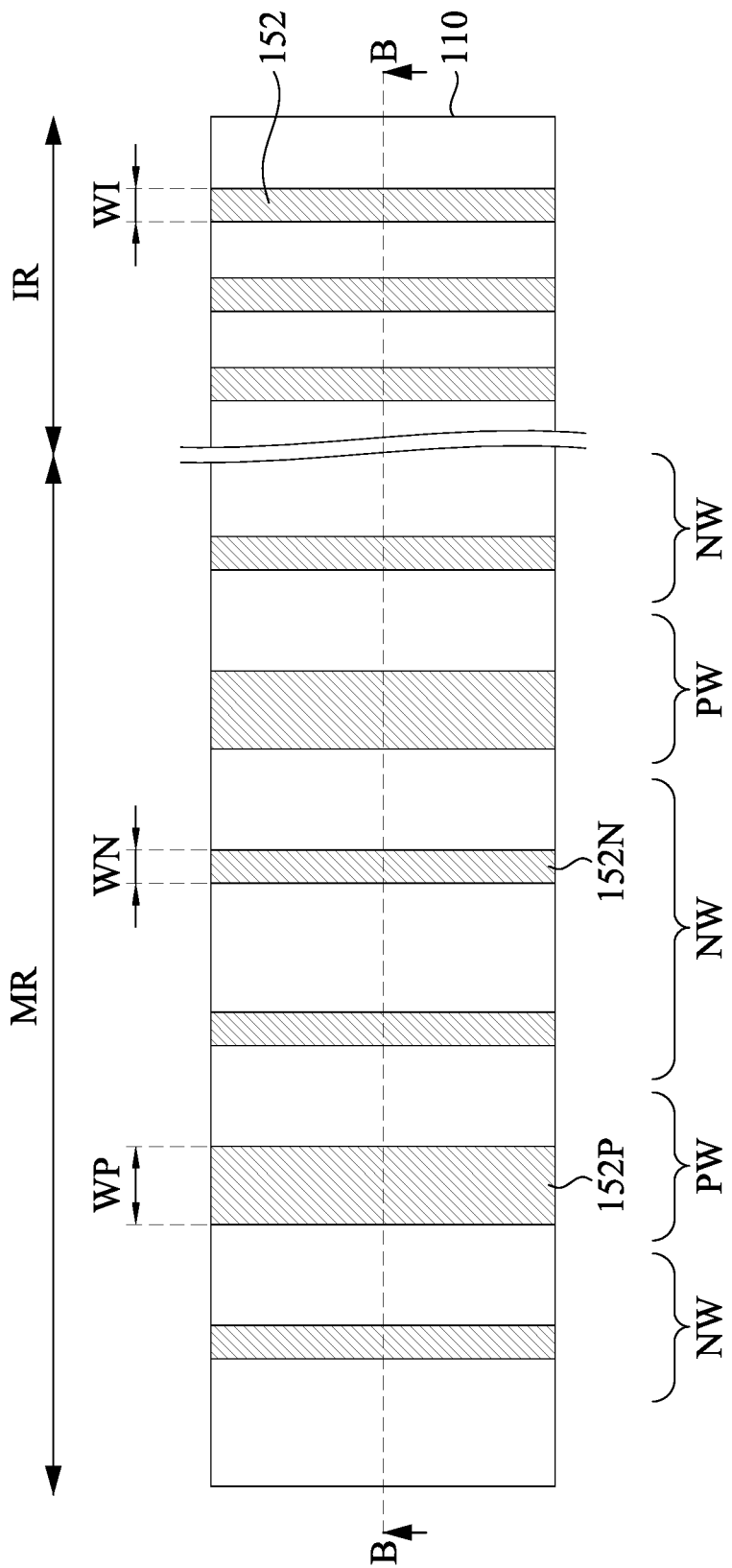
Figure 2B:
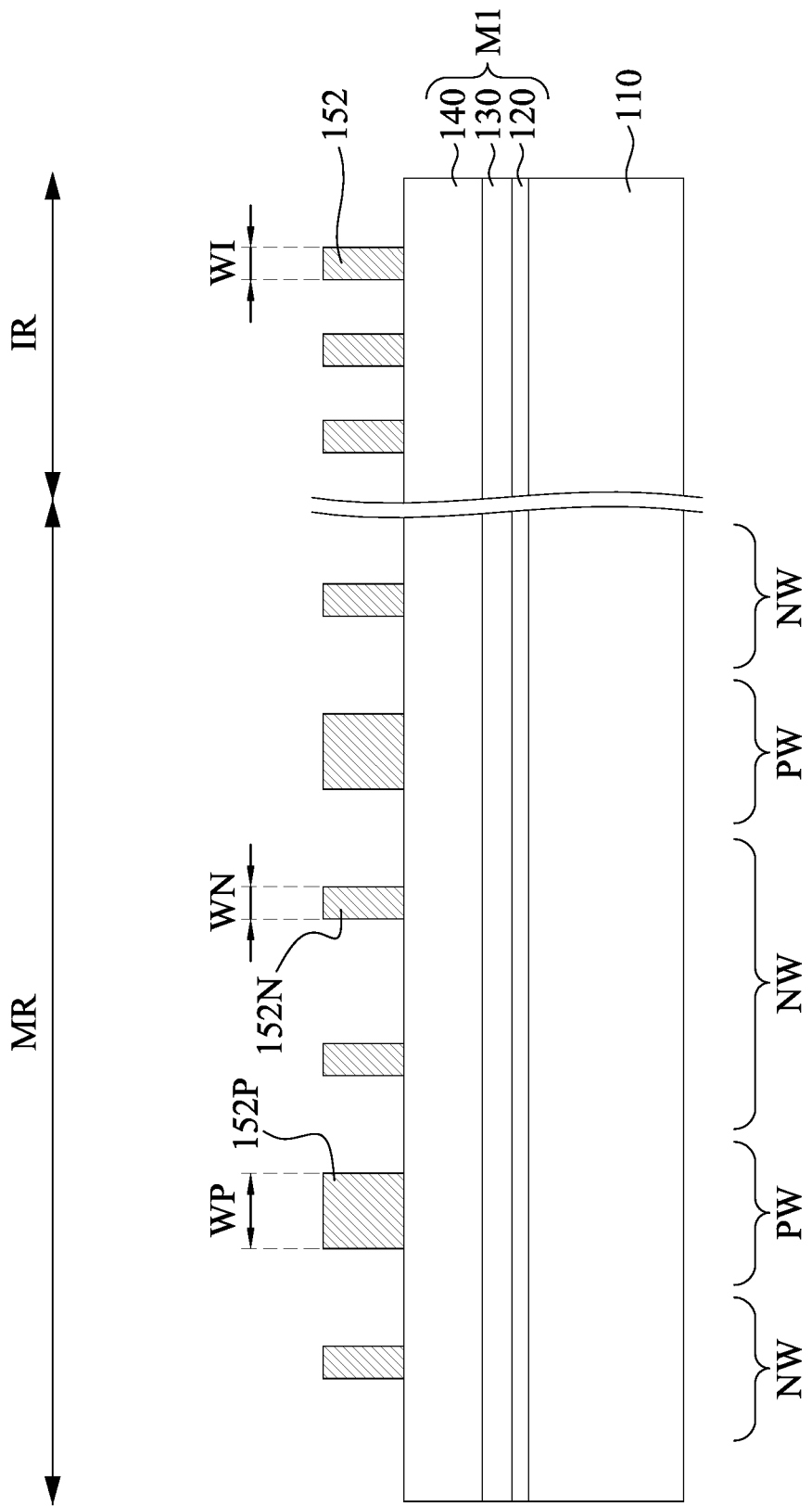

Reference is made to FIGS. 2A and 2B. FIG. 2B is a cross-sectional view taken along line B-B of FIG. 2A. The pattern is transferred from the top layer 170 of the resist layer P1 to the sacrificial layer 150 (referring to FIG. 1) to form one or more mandrels 152. Mandrels 152 are a feature shape that may be used to align subsequently formed spacers rather than to pattern the material layer M1 directly. The transfer may include suitable etching process including wet etching, dry etching, reactive ion etching, ashing, and/or other suitable technique. The resist layer P1 (e.g., the top layer 170 of the resist layer P1 in FIG. 1) may act as an etch mask in the etching process. The etching process and/or etching reagents may be selected to etch the sacrificial layer 150 (referring to FIG. 1) without significantly etching of the material layer M1, and after the etching process, remaining portions of the sacrificial layer 150 (referring to FIG. 1) are referred to as mandrels 152. After the formation of the mandrels 152, remaining resist P1 (referring to FIG. 1) may be removed by suitable stripping methods.

In some embodiments, according to the SRAM cell and the I/O circuit, positions and widths of the mandrels 152 are designed to achieve desired fin spaces or fin pitches in subsequent process. The mandrels 152 in p-type well regions PW in the memory region MR may be referred to as mandrels 152P, and the mandrels 152 in the n-type well regions NW in the memory region MR may be referred to as mandrels 152N.

For example, the mandrels 152P have a width WP, the mandrels 152N have a width WN, and the mandrels 152 in the I/O region TR have a width WI. In some embodiments, according to the design of SRAM cell, the width WP may be greater than the widths WN and WI. In some embodiments, the width WN may be greater than the width WI. Alternatively, the width WN may be equal to or less than the width WI.

Figure 3:
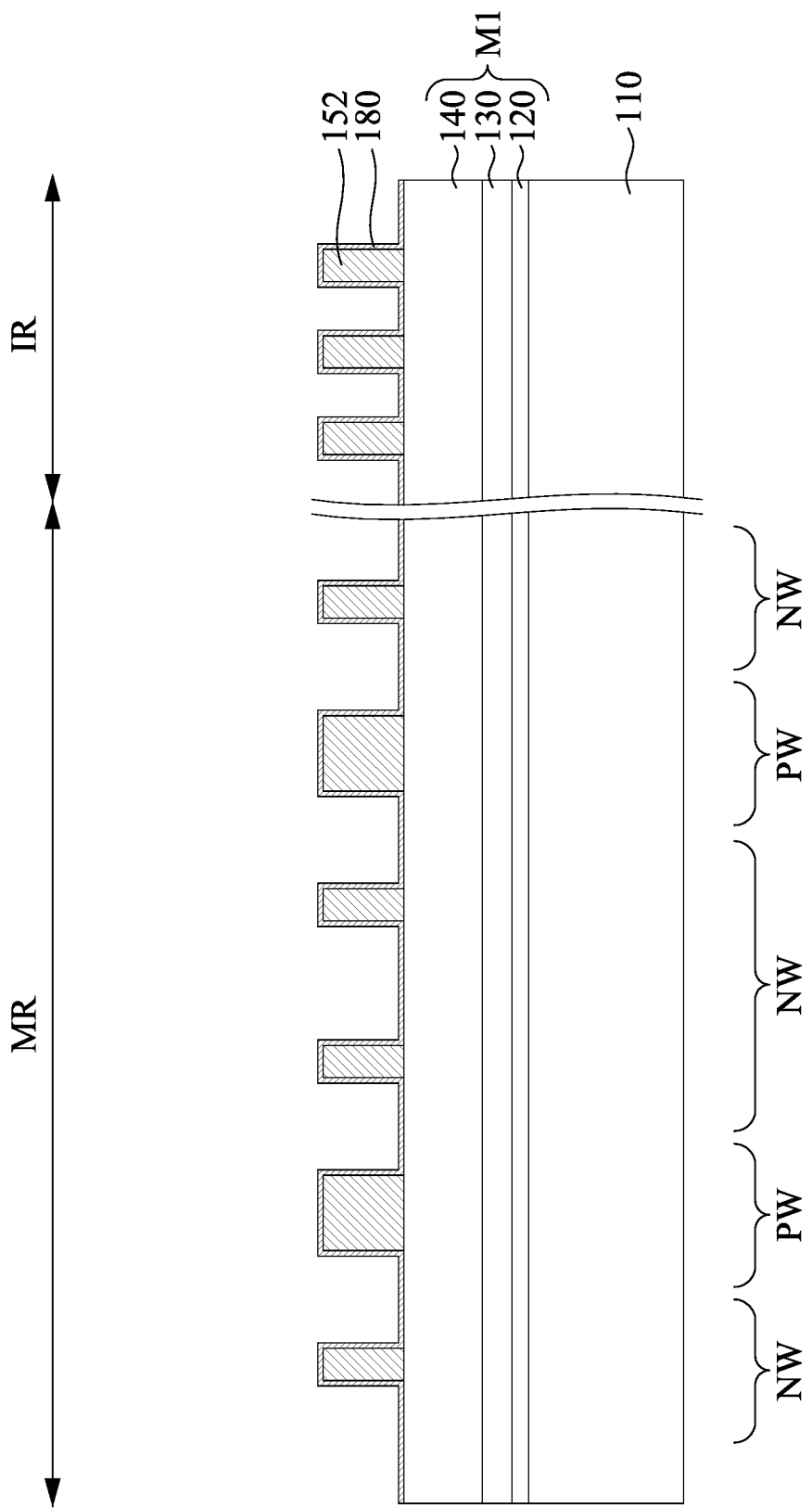

Reference is made to FIG. 3. A first spacer layer 180 is conformally deposited over the structure of FIG. 2B. In some embodiments, material of the first spacer layer 180 is selected to have different etchant sensitivity from the mandrels 152 and the third layer 140 of the material layer M1. For example, the first spacer layer 180 may include suitable semiconductor, semiconductor oxide, semiconductor nitride, semiconductor oxynitride, or other dielectric material. In some embodiments where the mandrels 152 include amorphous silicon and the third layer 140 include silicon nitride, the first spacer layer 180 may include silicon nitride. The first spacer layer 180 may be deposited by atomic layer deposition (ALD), chemical vapor deposition (CVD), plasma-enhanced CVD (PECVD), or other suitable deposition techniques.

Figure 4A:
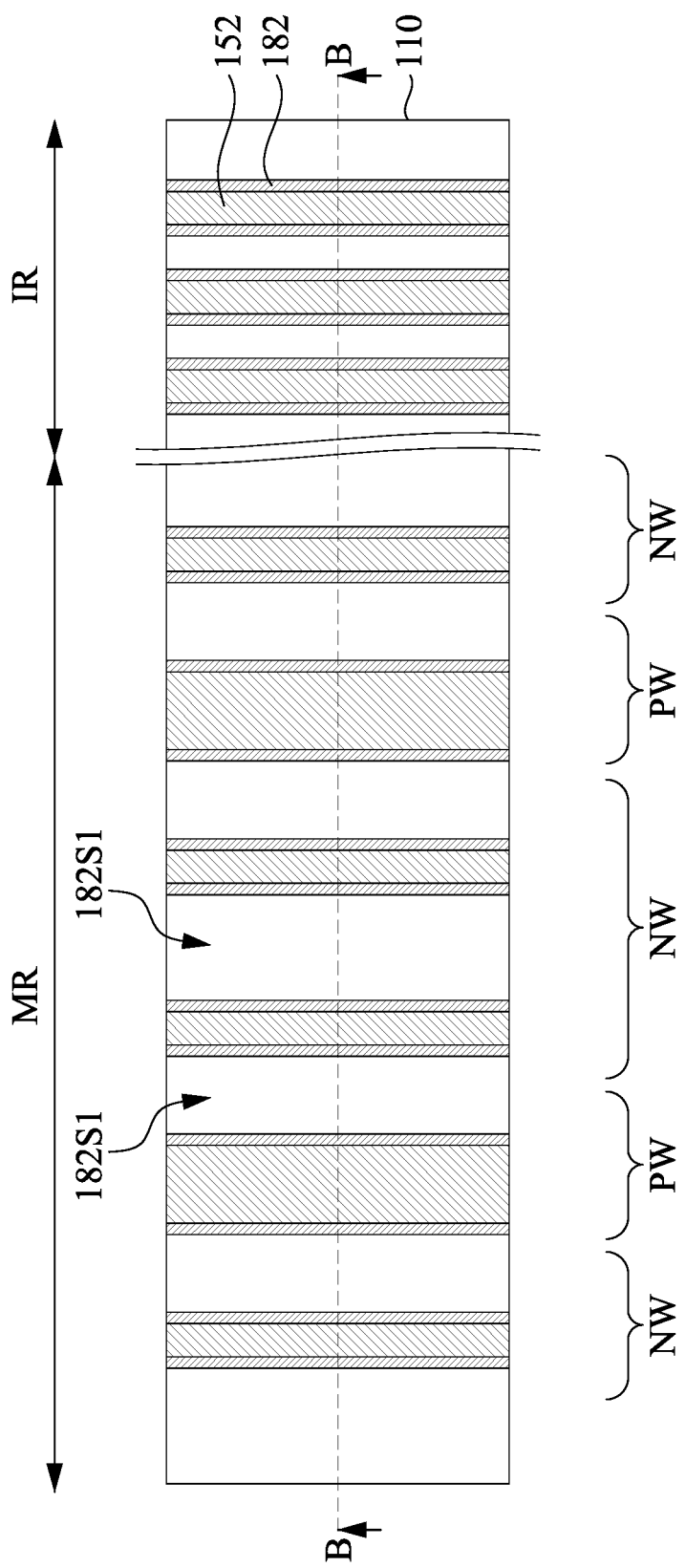
Figure 4B:
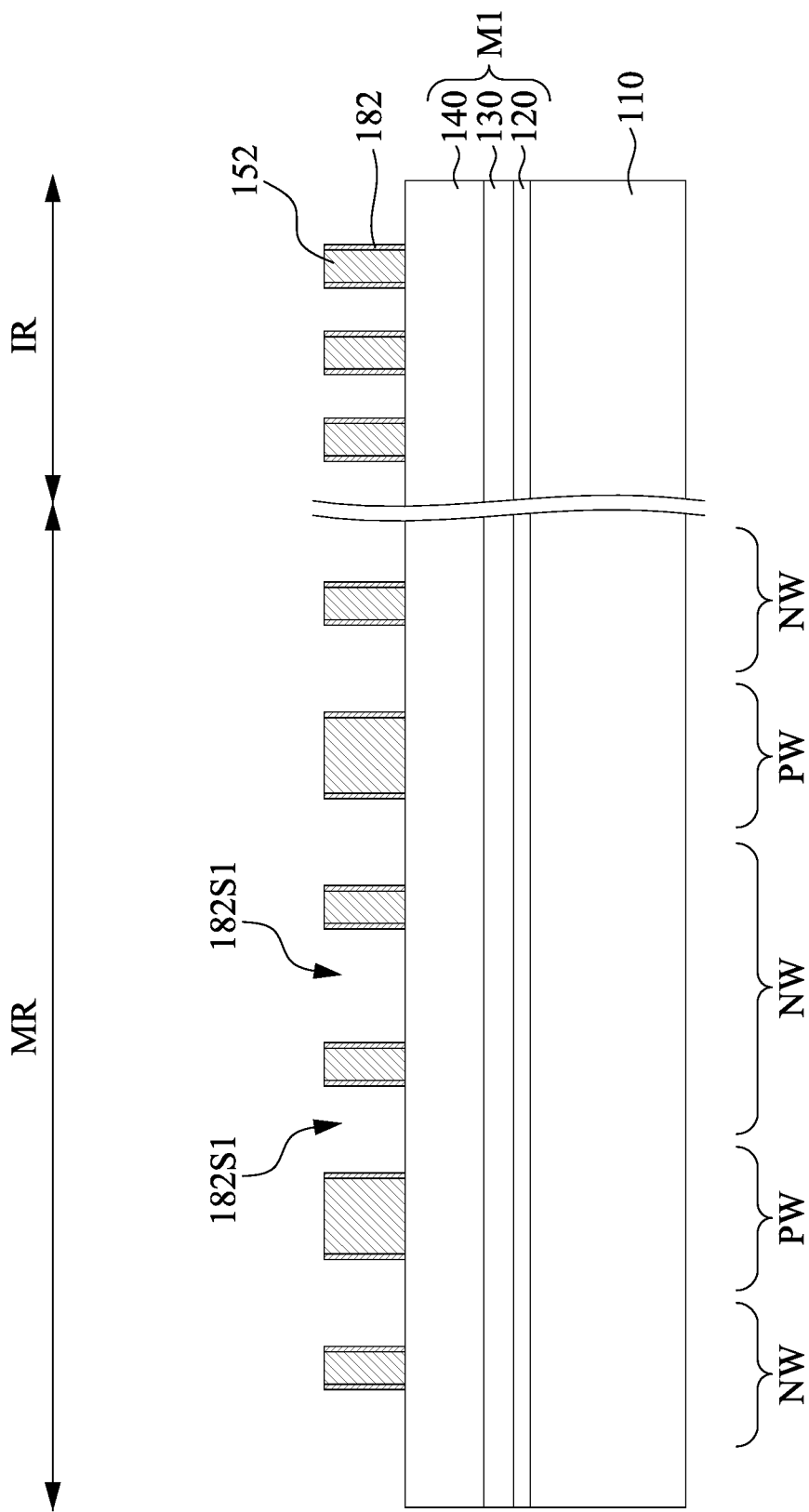

Reference is made to FIGS. 4A and 4B. FIG. 4B is a cross-sectional view taken along line B-B of FIG. 4A. An anisotropic etching process is performed to remove horizontal portions of the first spacer layer 180 (referring to FIG. 3), thereby forming the spacer masks 182 on sidewalls of the mandrels 152. The anisotropic etching process may be a dry etching process, such as plasma etching.

The spacer masks 182 will act as an etch mask in subsequent process of patterning the material layer M1. In some embodiment, an odd-numbered mask 182 is spaced apart from a following even-numbered mask 182 by the mandrels 152, and the even-numbered mask 182 is spaced apart from a following odd-numbered mask 182 by a space 182S1 resulted from the conformal deposition of the first spacer layer 180 (referring to FIG. 3).

In some embodiments, the deposition thickness of the first spacer layer 180 (referring to FIG. 3) and the etching technique are tuned to control the width of the spacer masks 182 and the space 182S1 between the spacer masks 182. For example, the first spacer layer 180 (referring to FIG. 3) may has a thickness in a range from about 5 nanometers to about 15 nanometers. If the thickness of the first spacer layer 180 is greater than about 15 nanometers, the narrow space may induce etch stop for fin etch in subsequent process. If the thickness of the first spacer layer 180 is less than about 5 nanometers, the formed fin in subsequent process may be too weak. In some embodiments, deposition and etching can be manipulated for more precise control of thickness of the spacer masks 182. Through the process, the spacer masks 182 may have a width less than the width WN and WI of the mandrels 152 (referring to FIG. 2B). Therefore, a subsequent fin patterning process may be performed with a mask having a small critical dimension (CD), thereby resulting small fin CD.

Figure 5A:
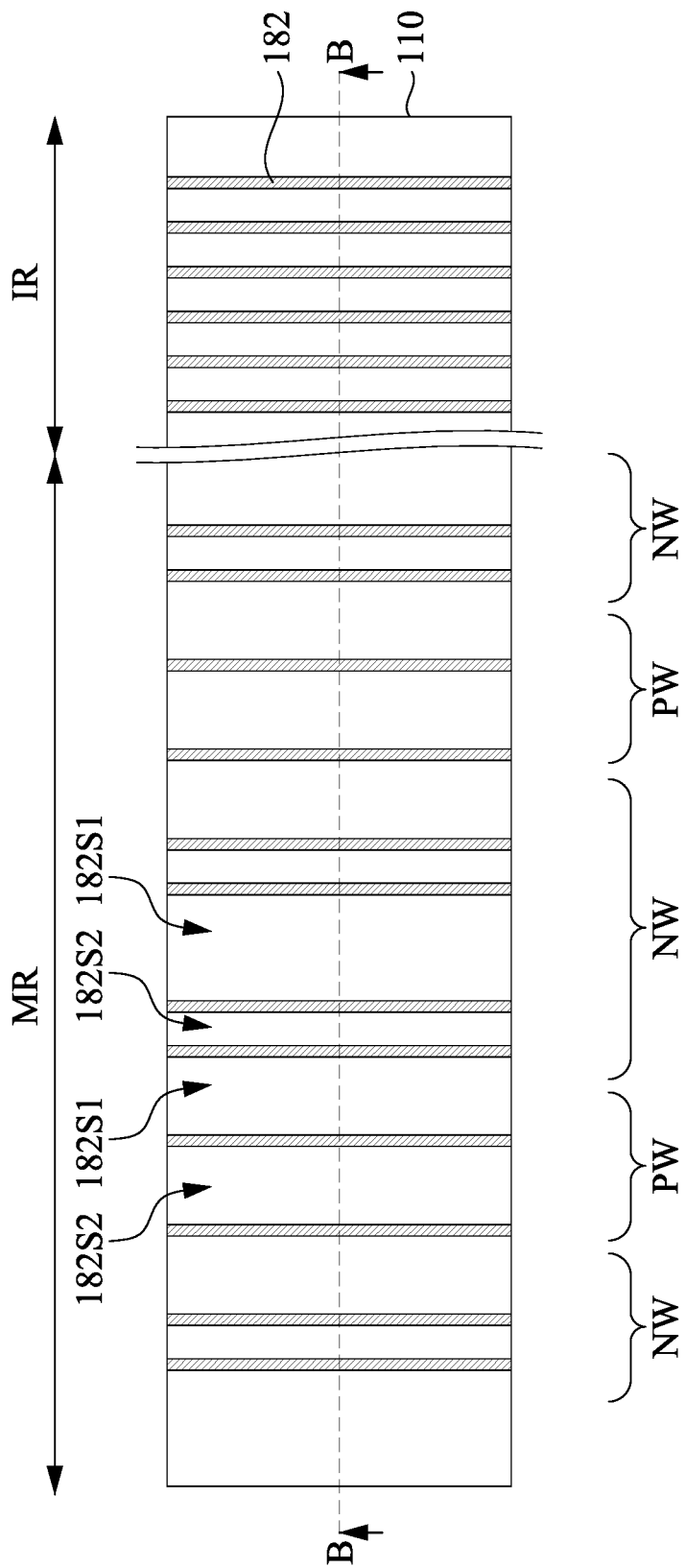
Figure 5B:
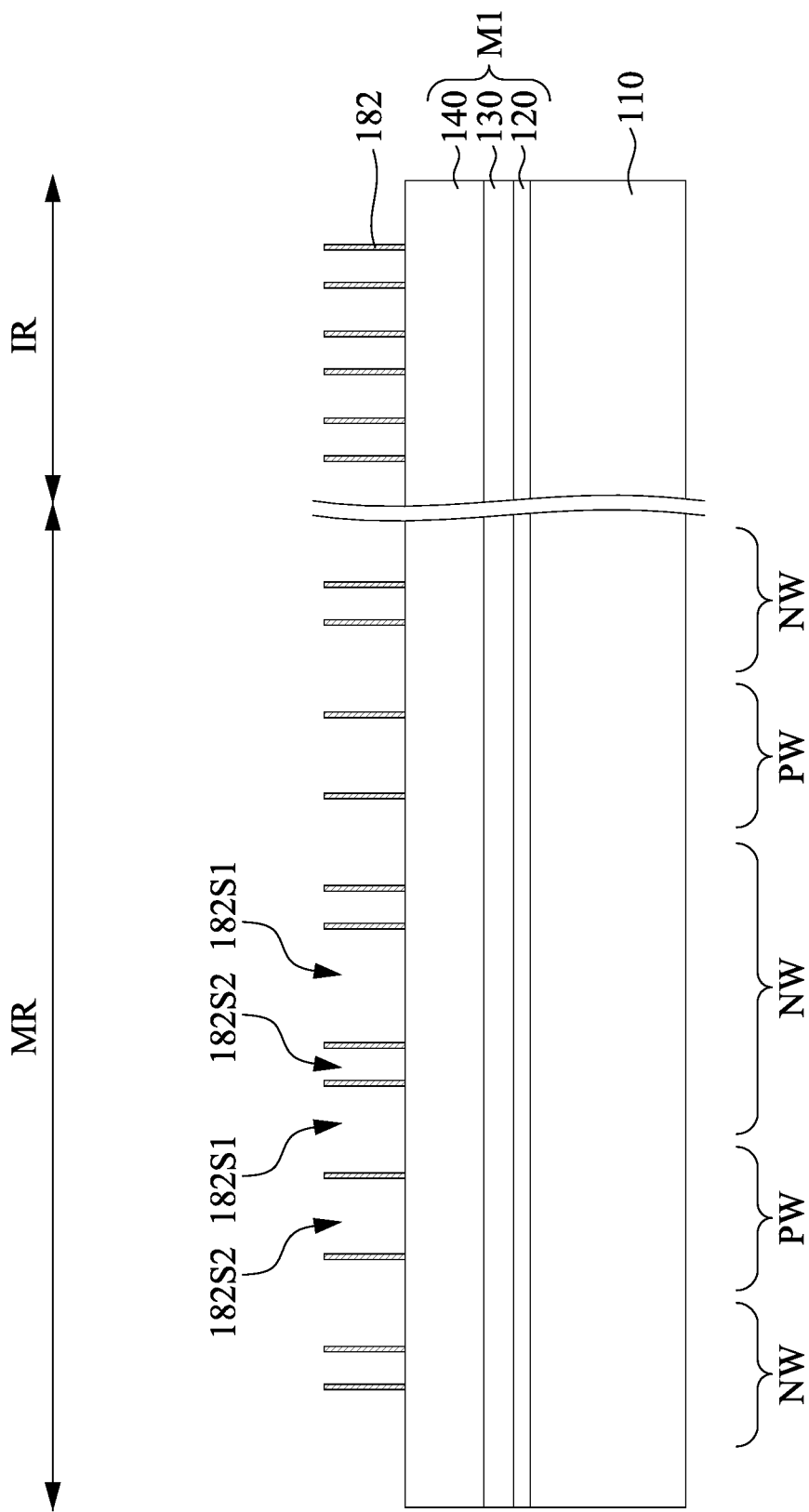

Reference is made to FIGS. 5A and 5B. FIG. 5B is a cross-sectional view taken along line B-B of FIG. 5A. The mandrels 152 (referring to FIGS. 4A and 4B) are removed, for example, by a selective etching process, leaving spacer masks 182 over the material layer M1. The removal of the mandrels 152 (referring to FIGS. 4A and 4B) may result in a space 182S2 between the odd-numbered mask 182 and the following even-numbered mask 182.

Figure 6:
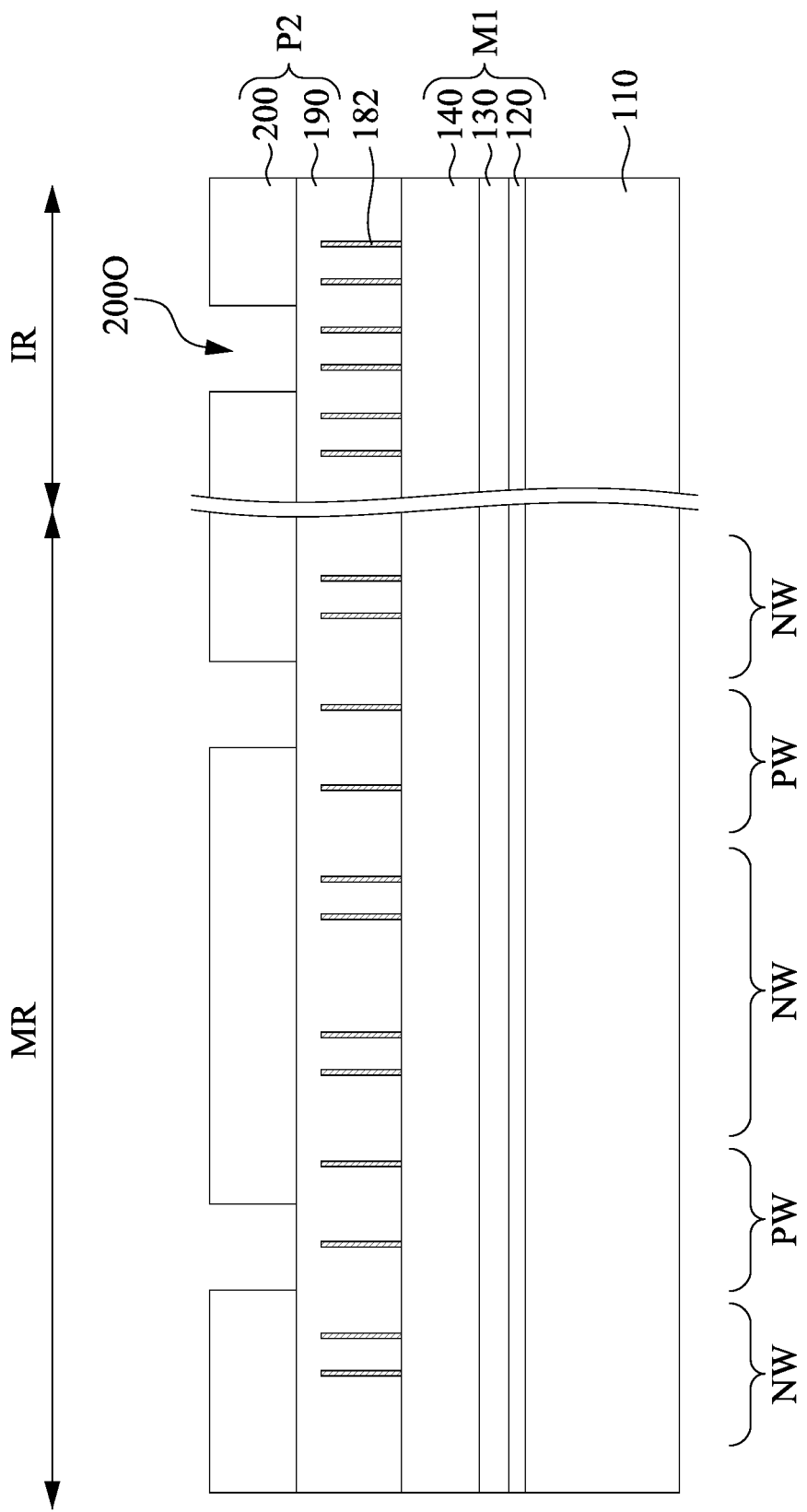

Reference is made to FIG. 6. A resist layer P2 is formed and subsequently patterned on the structure of FIGS. 5A and 5B. The resist layer P2 may include plural layers made of suitable material or composition. The exemplary resist layer P2 includes a bottom layer 190 and a top layer 200, each with different or at least independent materials. For example, the bottom layer 190 may include a carbon rich polymer material (e.g., $C_xH_yO_z$), and the top layer 200 may include a carbon rich polymer material (e.g., $C_xH_yO_z$) with a photosensitive component that causes the top layer 200 to undergo a property change when exposed to radiation. This property change can be used to selectively remove exposed (in the case of a positive tone resist) or unexposed (in the case of a negative tone resist) portions of the resist layer P2. It is understood that in other embodiments, the bottom layer 190 may be omitted. In some other embodiments, that additional layers may be provided as a part of the resist layer P2. For example, in some other embodiments, the resist layer P2 may be tri-layer resist layer, and a middle layer (not shown) including a silicon rich polymer material (e.g., SiCxHyOz) is formed between the bottom layer 190 and the top layer 200.

In some embodiments, the top layer 200 of the resist layer P2 is patterned to have openings 2000 first. Patterning may be performed using any suitable lithographic technique including photolithography and/or direct-write lithography. An exemplary photolithographic patterning process includes soft baking of the resist layer P2, mask aligning, exposure, post-exposure baking, developing the resist layer P2, rinsing, and drying (e.g., hard baking). An exemplary direct-write patterning process includes scanning the surface of the resist layer P2 with an e-beam or other energy source while varying the intensity of the energy source in order to vary the dosage received by various regions of the resist layer P2.

Figure 7A:
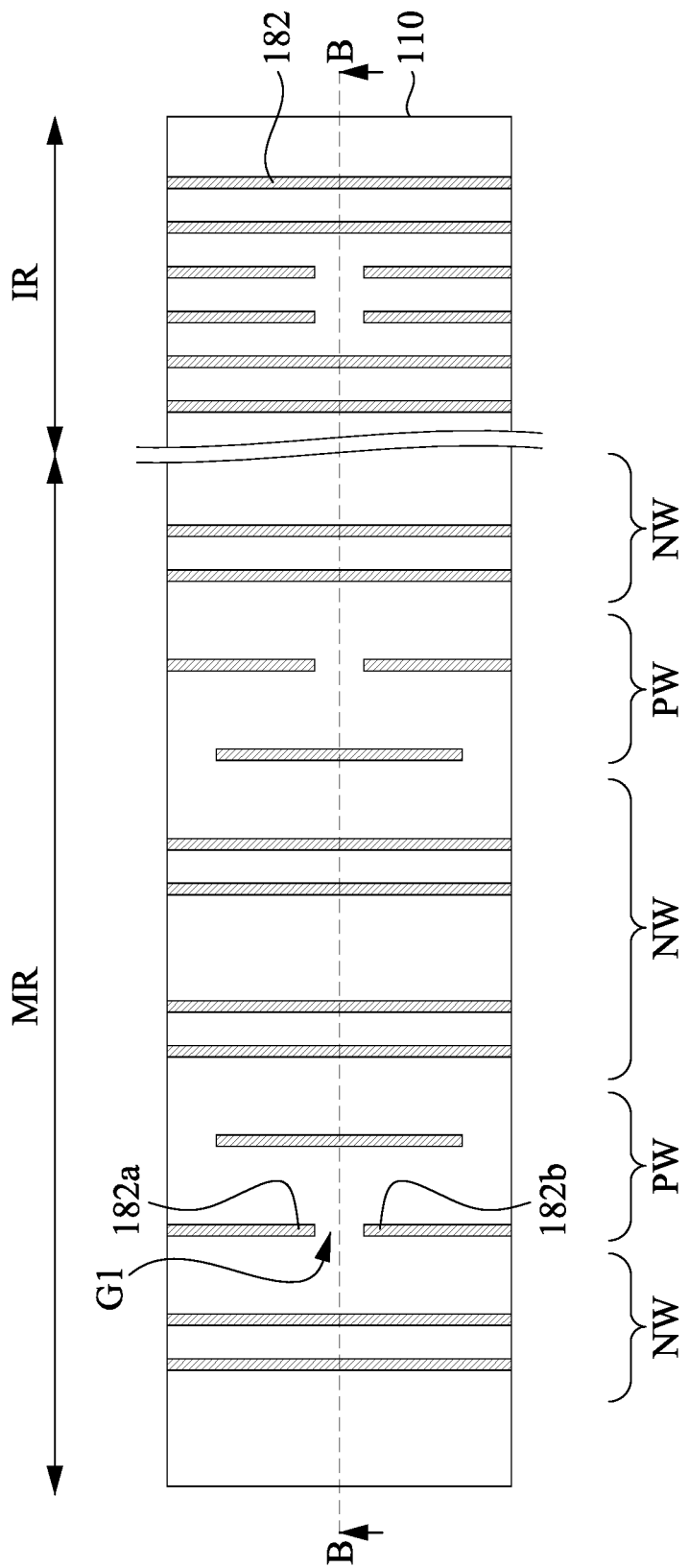
Figure 7B:
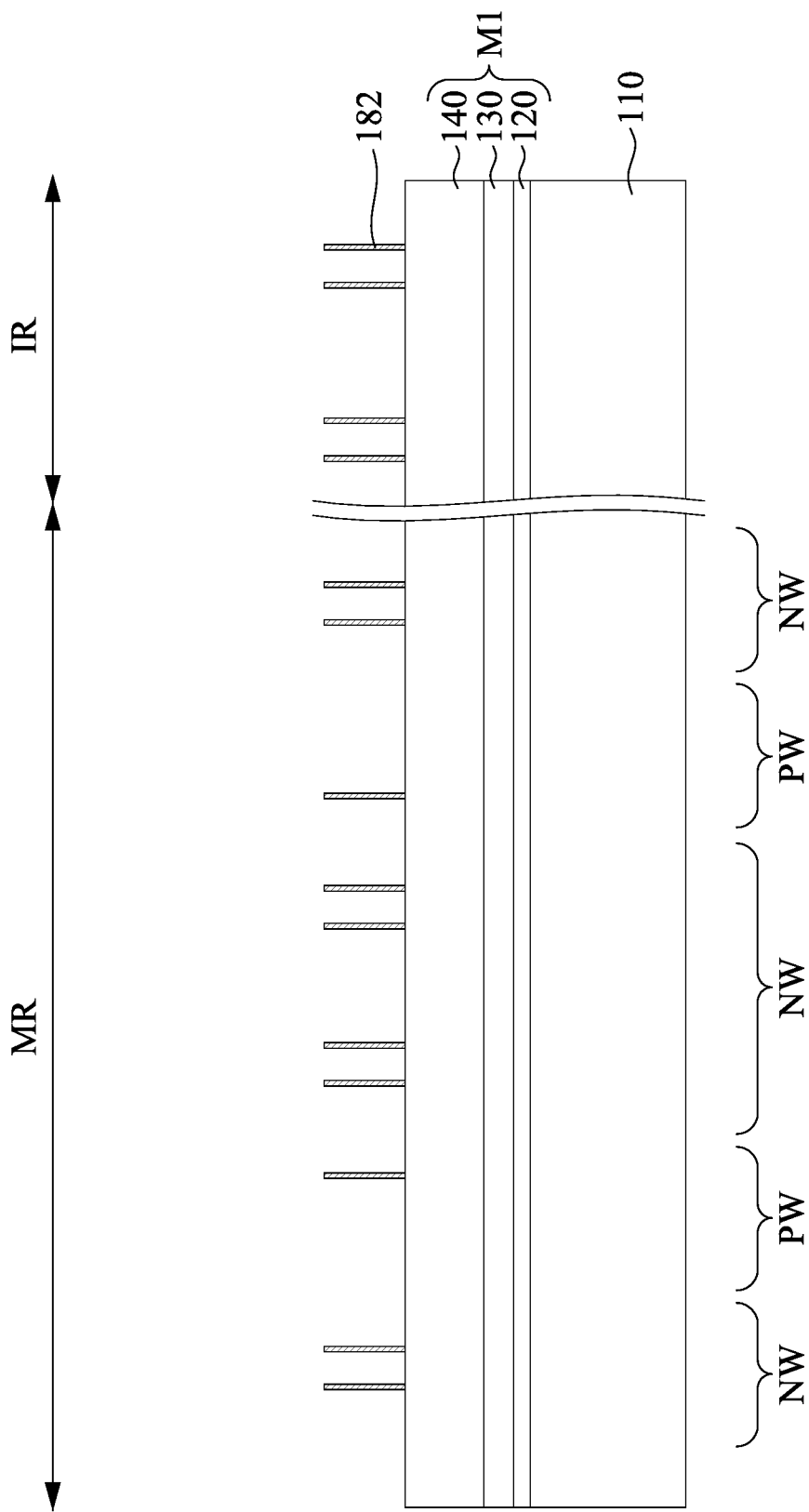

Reference is made to FIGS. 7A and 7B. Portions of the spacer masks 182 uncovered by the patterned top layer 200 of the resist layer P2 are removed by suitable etching process. The removal of portions of the spacer masks 182 may cause fin cut in subsequent fin patterning process. For example, a gap G1 is formed in one spacer mask 182, thereby cutting the spacer mask 182 into two separated portions 182a and 182b, which are separated by the gap G1. After the removal of portions of the spacer masks 182, remaining resist P2 may be removed by suitable stripping methods.

Figure 8:
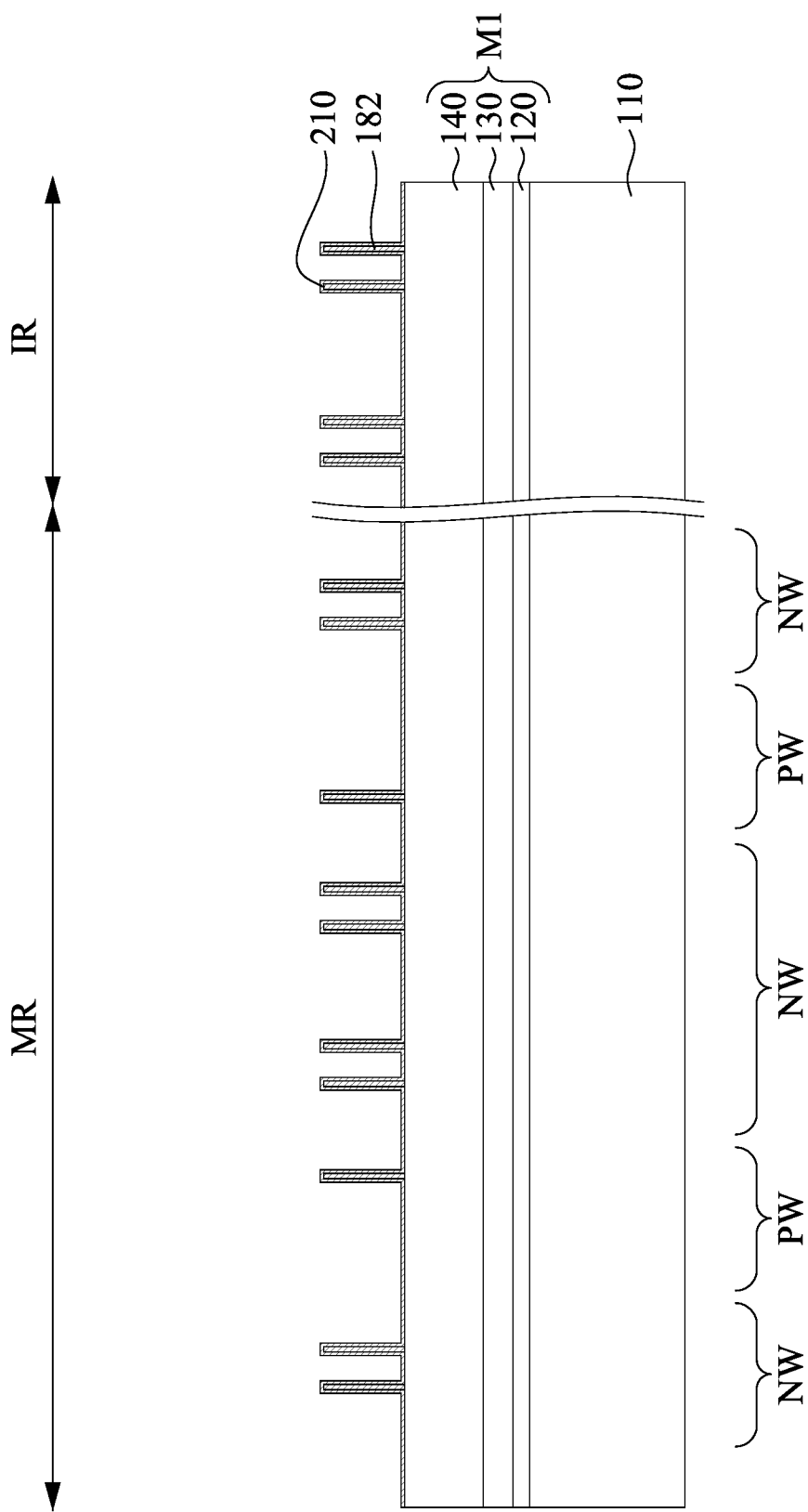

Reference is made to FIG. 8. A second spacer layer 210 may be deposited over the structure of FIGS. 7A and 7B. In some embodiments, material of the second spacer layer 210 is selected to have different etchant sensitivity from the third layer 140 of the material layer M1. For example, the second spacer layer 210 may include suitable semiconductor, semiconductor oxide, semiconductor nitride, semiconductor oxynitride, or other dielectric material. In some embodiments where the third layer 140 include silicon nitride, the second spacer layer 210 may include silicon nitride. The second spacer layer 210 may include the same material as that of the first spacer layer 180 (referring to FIG. 3). The second spacer layer 210 may be deposited by atomic layer deposition (ALD), chemical vapor deposition (CVD), plasma-enhanced CVD (PECVD), or other suitable deposition techniques.

Figure 9:
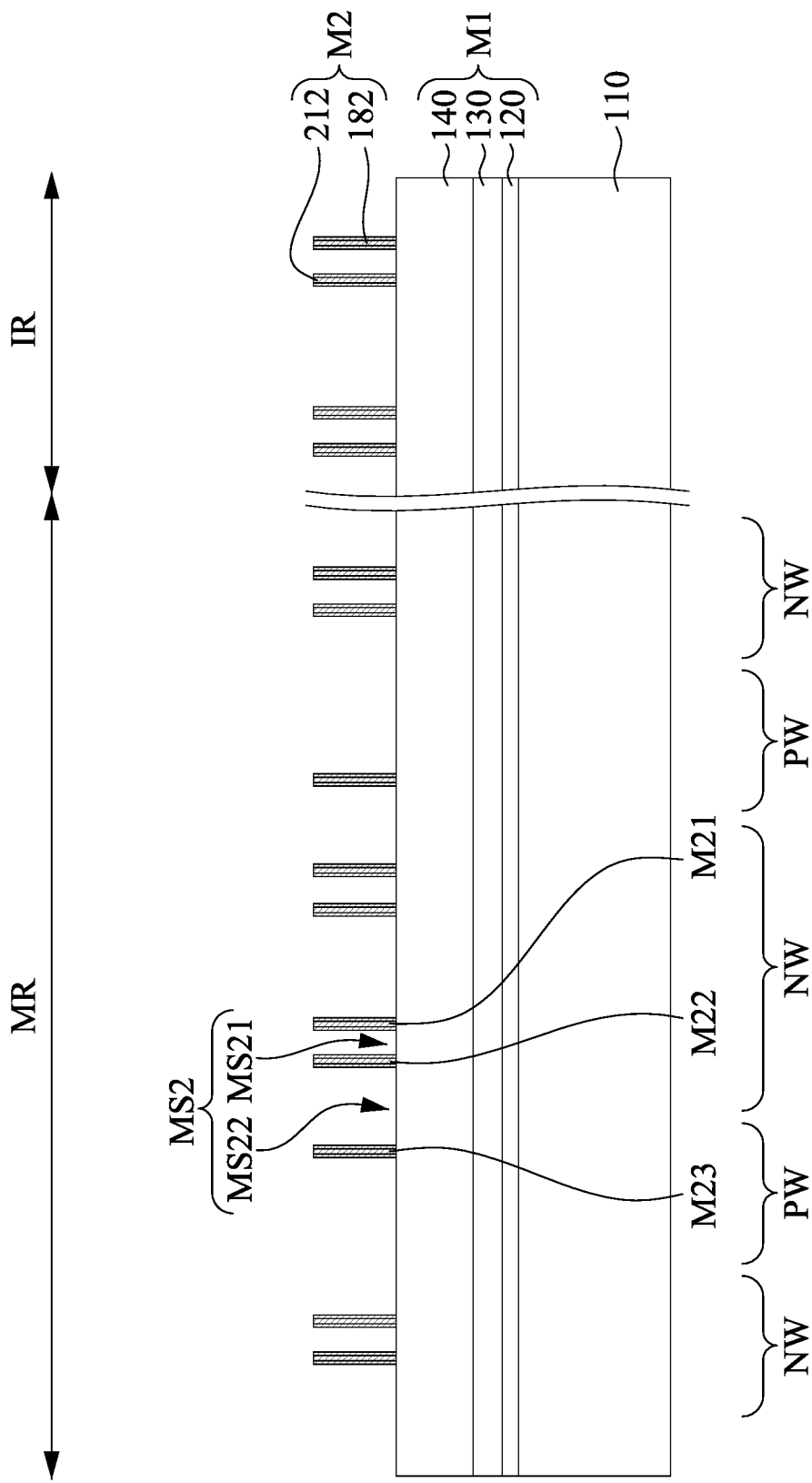

Reference is made to FIG. 9. The second spacer layer 210 is patterned into plural spacers 212 on opposite sidewalls of the spacer masks 182. The patterning process may include suitable etching process. For example, an anisotropic etching process, such as dry etch is performed to remove horizontal portions of the second spacer layer 210, and remaining vertical portions of the second spacer layer 210 forms the spacers 212. In some embodiments, patterning the second spacer layer 210 may reduce a height of the spacer masks 182. After the patterning process, the spacers 212 and the spacer masks 182 in combination may be referred to as spacer masks M2, in which a width of the spacer masks M2 is thicker than that of the spacer masks 182.

In some embodiments, the deposition thickness of the second spacer layer 210 (referring to FIG. 8) and the etching technique are tuned to control the width of the spacers 212 and the spaces MS2 between the spacer masks M2. In some embodiments, a thickness of the second spacer layer 210 (referring to FIG. 8) may be less than that of the first spacer layer 180 (referring to FIG. 3). For example, the second spacer layer 210 (referring to FIG. 8) may has a thickness in a range from about 5 nanometers to about 15 nanometers. If the thickness of the first spacer layer 180 is greater than 15 nanometers, the narrow space may induce etch stop for fin etch in subsequent process. If the thickness of the first spacer layer 180 is less than about 5 nanometers, the formed fin in subsequent process may be too weak.

For better illustration, some of the spacer masks M2 are labelled as M21, M22, and M22, and some of the spaces MS2 are labelled as space/distance MS21 and MS22. The spacer masks M21 and M22 are spaced apart from each other by a space/distance MS1, and the spacer masks M22 and M23 are spaced apart from each other by a space/distance MS2 greater than the space/distance MS1.

FIGS. 10-13 illustrate patterning the material layer M1. In some embodiments, the material layer M1 is patterned by atomic layer etching (ALE) process, which is further illustrated in FIGS. 17A and 17B. Atomic layer etching (ALE) is an etch process for removing a thin layer of material by plural cycles. During each cycle of the ALE process, a thickness of the removed layer is approximately one to several atoms thick. An etchant species is disposed over a top layer of a surface of a material to be etched. The etchant species bonds with surface atoms of the material to be etched. A charged ion bombardment is then guided to the etchant layer in order to remove the etchant layer and the atoms bonded to the etchant layer. With a controlled beam bombardment in conjunction with the etchant species, a designed atomic scale thickness is removed by each cycle of the ALE process. ALE processes are repeated until a desired amount of material is removed from the material to be etched. In some embodiments, the ALE process in FIGS. 8-11 may also be referred to as quasi-ALE process.

Figure 10:
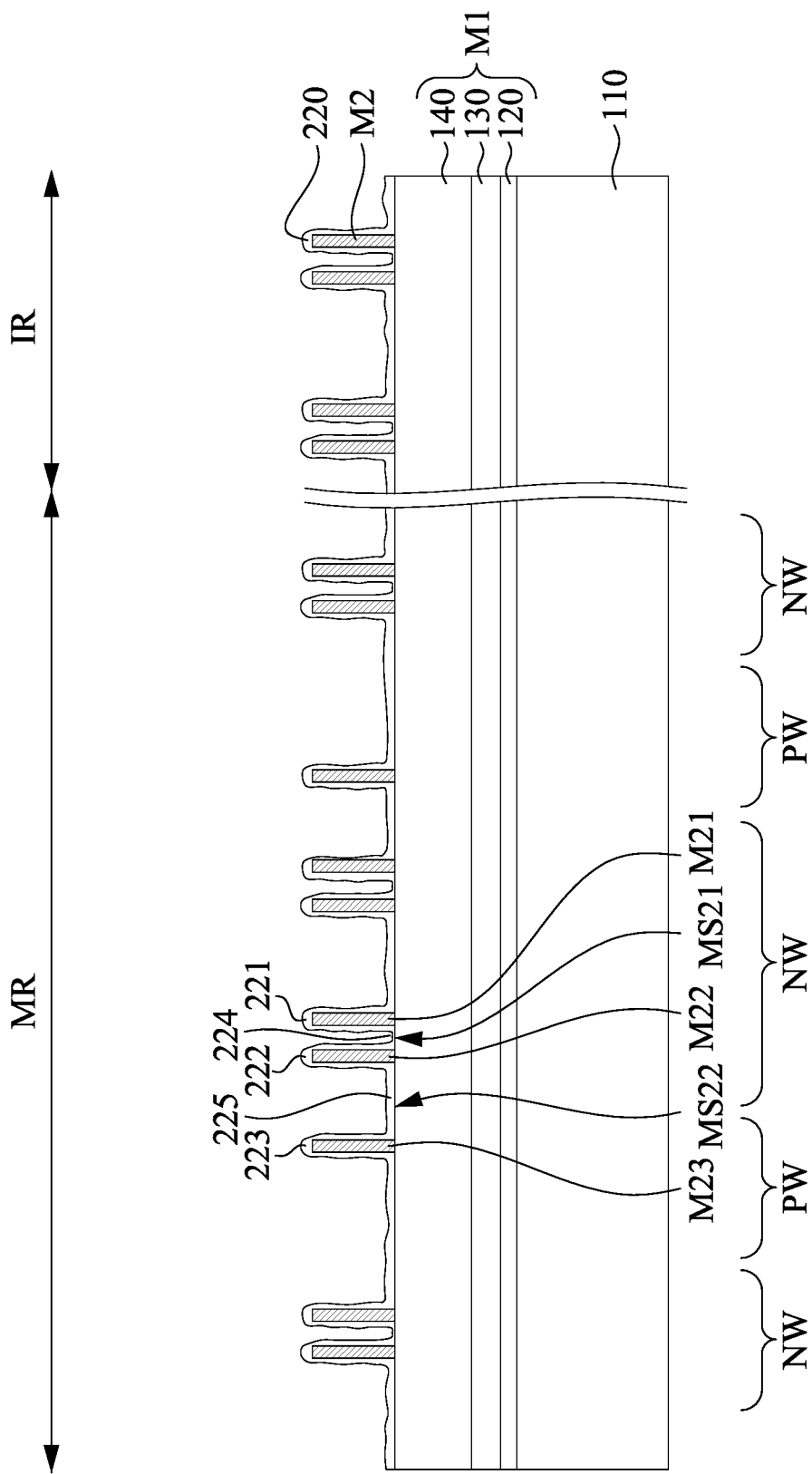

Referring to FIG. 10. An etchant material layer 220 is deposited over the structure of FIG. 9. The deposition of the etchant material layer 220 may include dosing of the substrate with an etching gas, such that a surface layer of the third layer 140 adsorb the etch material in the etching gas. The etching gas may be plasma dissociated to enhance the rate of adsorption. For example, the etching gas may include $C_4F_6$, $O_2$, the like, or the combination thereof. In some embodiments, the etching gas may be a mixture of fluoride-containing gas and oxide-containing gas, such as a mixture of $C_4F_6$ and $O_2$. With the choice of dosing gas and parameters, this can be self-limiting, if the chemical etching dose stops after adsorbing one monolayer. In some embodiments, the etchant material layer 220 may be a carbon-rich layer, such as a fluorocarbon layer. After the deposition of the etchant material layer 220, a surface layer of the third layer 140 adsorbs elements of etchant material layer 220, and the residual dose gas may be purged and removed from chamber.

In some embodiments, the etchant material layer 220 has portions 221-223 respectively around the spacer masks M21-M23 and portions 224 and 225 respectively in the spaces MS21 and MS22. In some embodiments, the portion 224 connects the portion 221 to the portion 222, and the portion 225 connects the portion 222 to the portion 222. In some embodiments, since the space MS22 is greater than the space MS21, the deposited the etchant material layer 220 may experience space loading issues, such that a thickness of the portion 225 of the deposited the etchant material layer 220 is greater than a thickness of the portion 224 of the deposited the etchant material layer 220. For example, a top surface of the portion 225 is higher than a top surface of the portion 224. In some embodiments, the deposition is controlled such that portion 221 of the deposited the etchant material layer 220 is not merged with the portion 222 of the deposited the etchant material layer 220.

For example, in the ALE process (referring to FIGS. 10-14), the etchants and the dose of the etchants are chosen to be a gas mixture of $C_4F_6$ and $O_2$. For example, in the ALE process, the $C_4F_6$ may be provided with a flow in a range of from about 1 sccm to about 20 sccm, and the $O_2$ may be provided with a gas flow in a range of from 1 sccm to about 20 sccm. If the provided $C_4F_6$ flow is greater than about 20 sccm or lower than about 1 sccm, bridge issue may become serious. If the provided $O_2$ flow is greater than about 20 sccm or lower than about 1 sccm, bridge issue may become serious.

Figure 11:
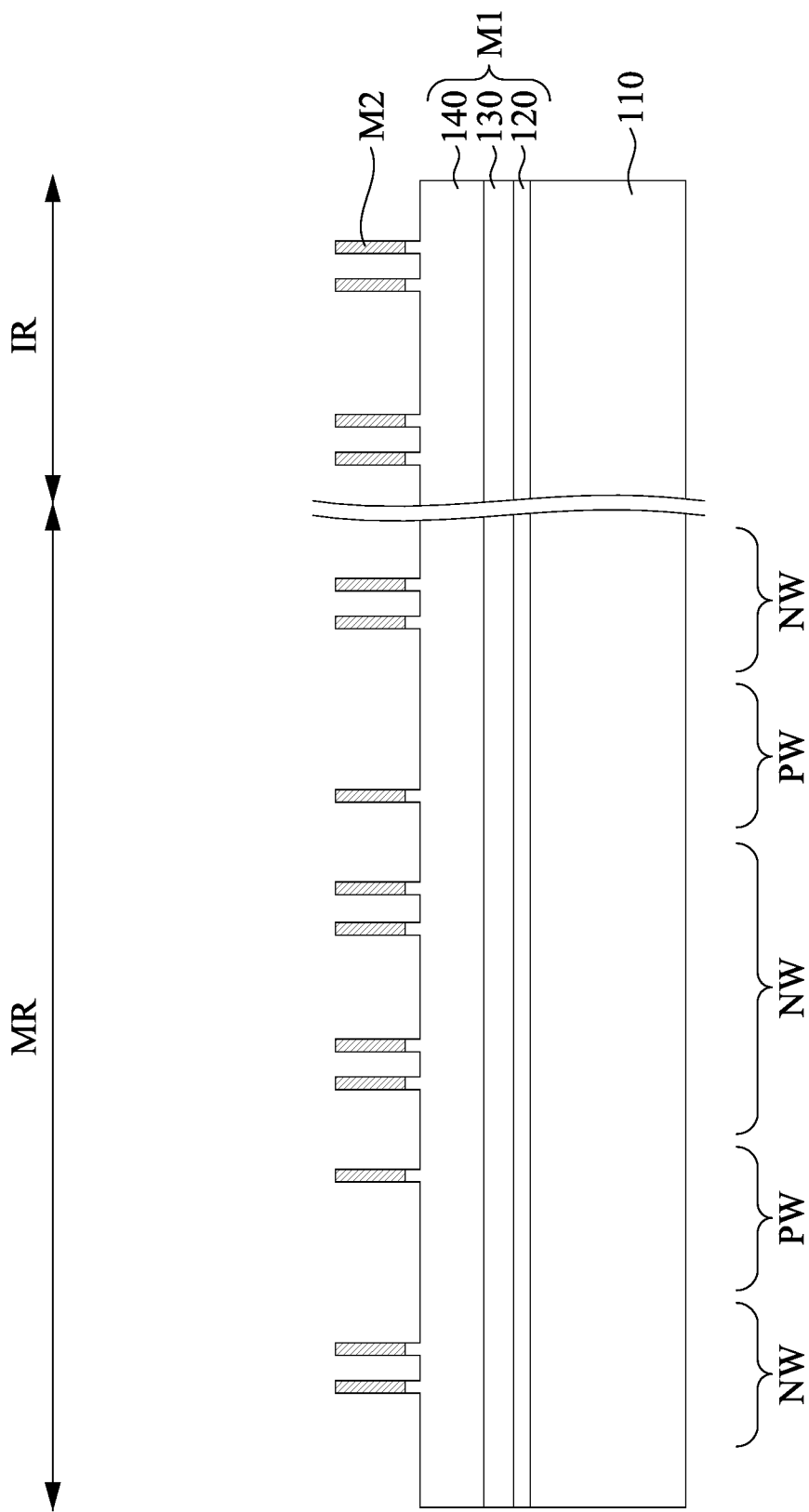

Reference is made to FIG. 11. While the surface layer of the third layer 140 adsorbs the elements of etchant material layer 220, an ion bombardment is performed to activate the reaction among positive ions, the surface layer of the third layer 140 and the elements of etchant material layer 220, thereby removing the reacted surface layer of the third layer 140. This can be self-limiting if the energy of the ions is sufficient to remove the surface layer of the third layer 140 that adsorbs the etchant material layer 220, but insufficient to (sputter) etch the underlying portion of the third layer 140 that does not adsorb the etchant material layer 220. In some embodiments, during the ion bombardment, an Ar flow is introduced into the chamber with about 500 sccm to about 1000 sccm. If the flow is less than 500 or greater than 100, the plasma density may not be suitable when a capacitively coupled plasma (CCP) dry etch equipment is used. In some embodiments, during the ion bombardment, none of the etchant species is introduced into the chamber. For example, during the ion bombardment, the $C_4F_6$ flow and $O_2$ gas flow may be about 0 sccm in the ALE etching step for clear switch. After the surface layer of the third layer 140 is removed, etching products are purged from the chamber. For example, a top surface of the third layer 140 in FIG. 11 is lower than a top surface of the third layer 140 in FIG. 10.

In some embodiments, the spacer masks M2 is more inactive to the etchant material layer 220 than the third layer 140 is, such that the ion bombardment may not cause reaction between the spacer masks M2 and the elements of etchant material layer 220, and therefore not remove the spacer masks M2. Through the configuration, the spacer masks M2 may act etch masks in the ALE process. In other words, the spacer masks M2 have a higher etch resistance to the ALE process than the third layer 140. In some embodiments, the ion bombardment process may be performed with a suitable angle based on the fin pitch and/or the fin height of the fins. For example, the ion bombardment process may be performed in a direction normal to a top surface of the substrate 110 with argon ions. Through the operation, a portion of the third layer 140 uncovered by spacer masks M2 is thinned by the ALE process, and a portion of the third layer 140 covered by spacer masks M2 is protected from being thinned.

Figure 12:
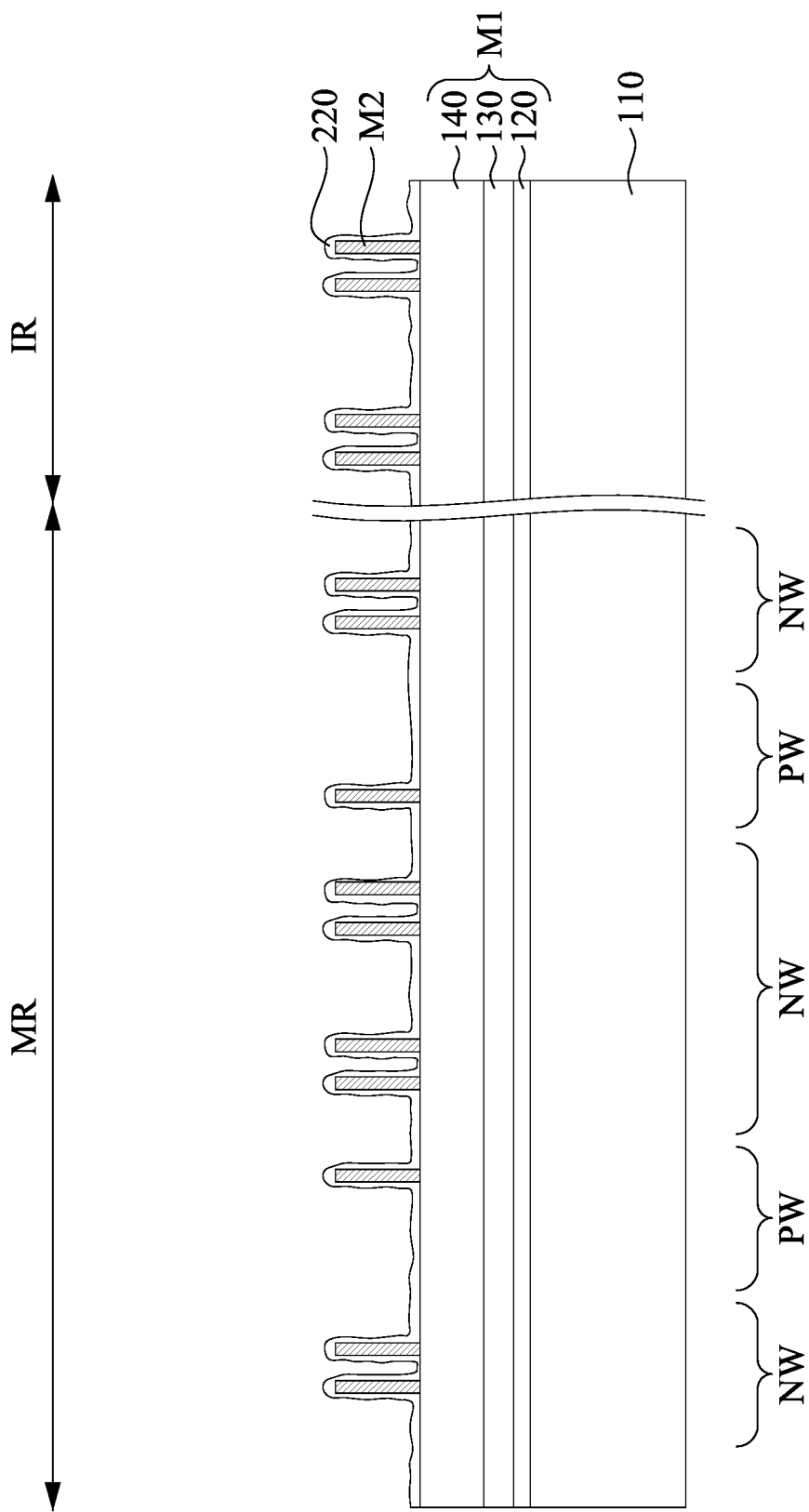
Figure 13:
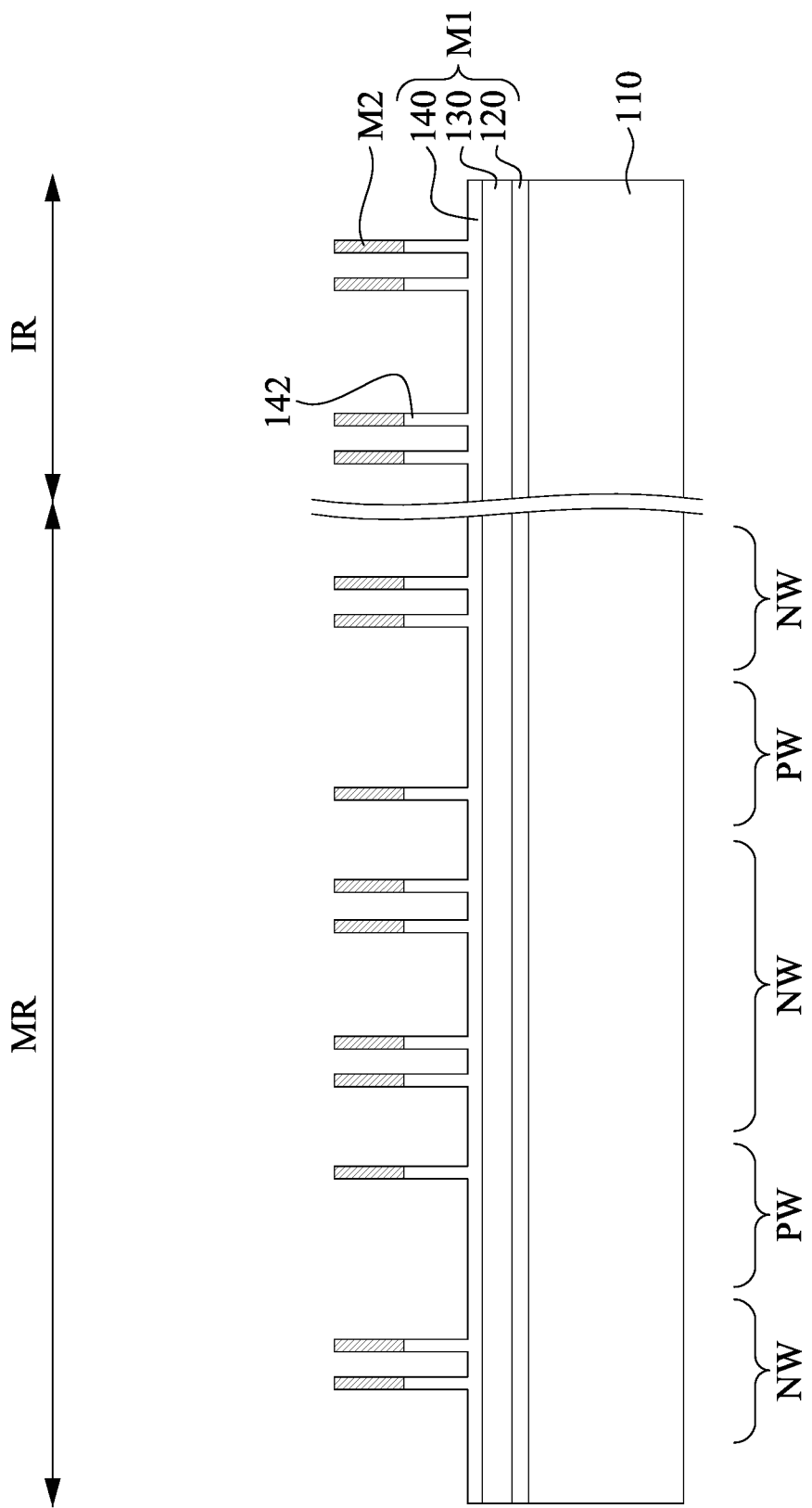

Reference is made to FIGS. 12 and 13, the steps in FIGS. 10 and 11 are repeated. For example, a next etchant material layer 220 is deposited over the structure of FIG. 11. The deposition of the etchant material layer 220 may include dosing of the substrate with an etching gas, such that a surface layer of the third layer 140 adsorb the etch material in the etching gas. The etching gas may be plasma dissociated to enhance the rate of adsorption. For example, the etching gas may include $C_4F_6$, $O_2$, the like, or the combination thereof. In some embodiments, the etching gas may be a mixture of $C_4F_6$ and $O_2$. With the choice of dosing gas and parameters, this can be self-limiting, if the chemical etching dose stops after adsorbing one monolayer. In some embodiments, the etchant material layer 220 may be a carbon-rich layer, such as a fluorocarbon layer. After the deposition of the etchant material layer 220, the residual dose gas may be purged and removed from chamber.

Reference is made to FIG. 13. An ion bombardment is performed to activate the reaction among positive ions, the surface layer of the third layer 140, and elements of the etchant material layer 220, thereby removing the reacted surface layer of the third layer 140. This can be self-limiting if the energy of the ions is sufficient to remove the surface layer of the third layer 140 that adsorbs the etchant material layer 220, but insufficient to (sputter) etch the underlying portion of the third layer 140 that does not adsorb the etchant material layer 220. After the surface layer of the third layer 140 is removed, etching products are purged from the chamber.

The ALE process (the steps in FIGS. 10 and 11 or the steps in FIGS. 12 and 13) may be cycled until a desired amount of the third layer 140 is removed. For example, the ALE process may be repeated until a top surface of the second layer 130 is exposed. In some embodiments, in each cycle of the ALE process, the etchant material layer 220 may be deposited by the same gases and gas doses. Alternatively, in some other embodiments, the etchant material layer 220 may be deposited using suitable gases and gas doses that are not the same. In some embodiments, for patterning the third layer 140, the deposition and bombardments may be cycled over a hundred times.

In some embodiments, in each cycle of the ALE process, a time duration for introducing the $C_4F_6$ and $O_2$ gas is in a range of about 0.001 seconds to about 10 seconds, and a time duration for introducing the Ar gas is in a range of about 0.001 seconds to about 10 seconds. A ratio of the time duration for introducing the $C_4F_6$ and $O_2$ gas to the time duration for introducing the Ar gas may be in range form 0.2 to about 5. In furtherance of the embodiments, in each cycle of the ALE process, the time duration for introducing the $C_4F_6$ and $O_2$ gas may be shorter than the time duration for introducing the Ar gas. That is, the deposition operation (e.g., FIGS. 10 and 12) takes less time than the etching operation (or bombardment). In other word, the etching operation (or bombardment) is performed with a time duration longer than that of the deposition operation (e.g., FIGS. 10 and 12).

In each cycle of the ALE process, the deposition process and the etching operation (or bombardment) are performed in a plasma chamber with a bias power, which may be supplied to wafer chunk that holds the substrate. In some embodiments, a bias power during the bombardment process may be greater than a bias power during the deposition operation (e.g., FIGS. 10 and 12). For example, in the deposition operation (e.g., FIGS. 10 and 12), the wafer chunk is bias to a power in a range of about 20 W to about 200 W; and in the bombardment process, the wafer chunk is bias to a power in a range of about 50 W to about 300 W. If the powers in the ALE process are out of the range, fin bridge issue may become serious.

In some embodiments, in the ALE process, the wafer chunk may be at a temperature range of about 50 Celsius degrees to about 150 Celsius degrees. If the temperature is out of the range, OX/SN film etch selectivity may become undesired, and CD loading effect may also be a concern. In some embodiments, in the ALE process, a pressure in the chamber may be in a range of about 5 mT to about 50 mT. For advanced etch process, the pressure is designed to be less than about 50 mT. If the pressure is less than about 5 mT, plasma density may unwantedly decrease. In some embodiments, in the deposition operation (e.g., FIGS. 10 and 12) and the ion bombardment process, the wafer chunk may be kept substantially at the same temperature, and the chamber may be kept substantially at the same pressure. That is, temperature and pressure may not change according to the deposition operation (e.g., FIGS. 10 and 12) and the ion bombardment process.

Figure 14:
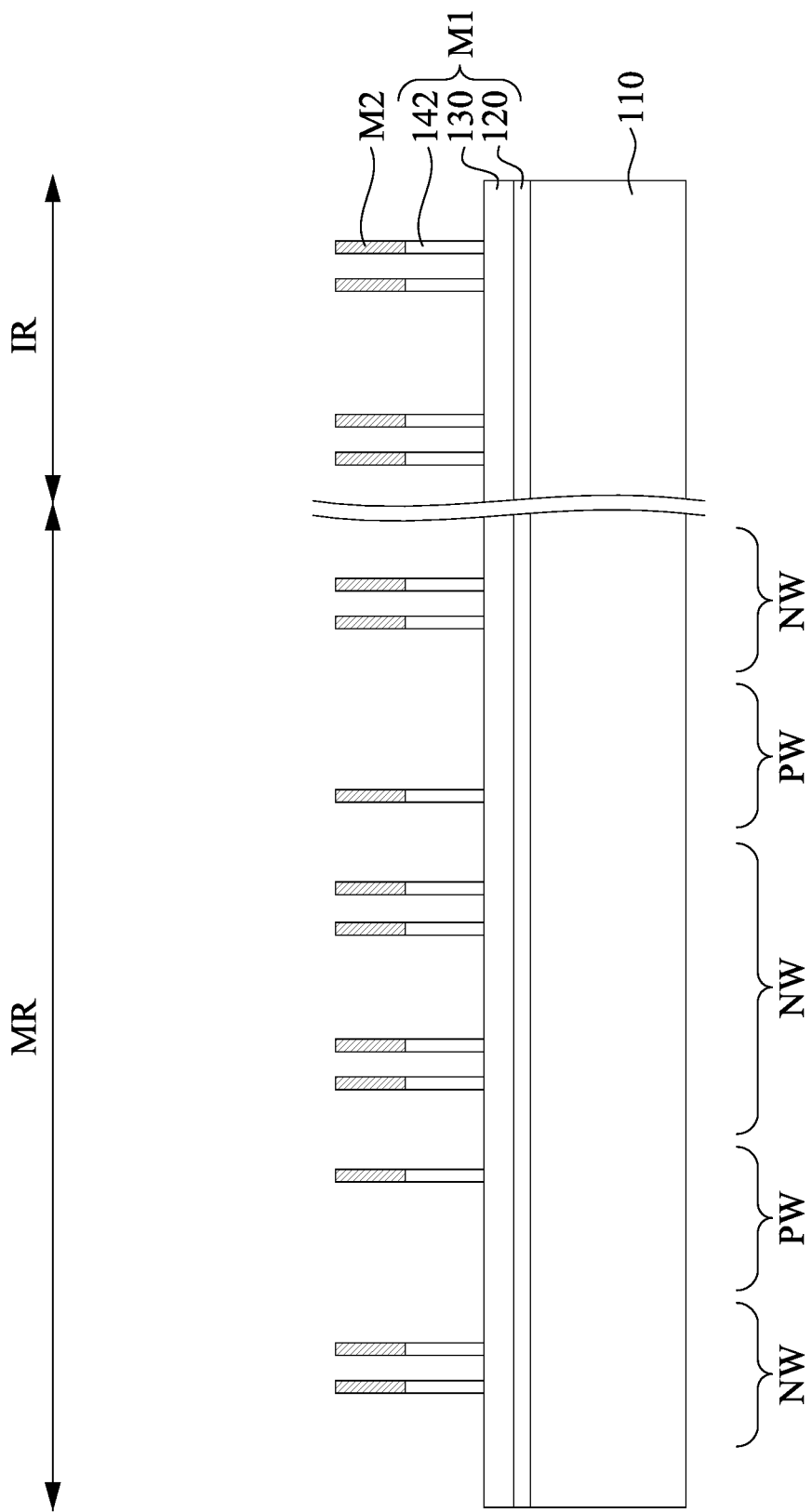

In some embodiments, the second layer 130 is more inactive to the etchant material layer 220 than the third layer 140 is, such that the ion bombardment may not cause reaction between positive ions, the second layer 130, and elements of the etchant material layer 220. Through the configuration, the second layer 130 may act as an etch stop layer in the ALE process. In other words, the second layer 130 of the material layer M1 has a higher etch resistance to the ALE process than the third layer 140. Using the spacer masks M2 serving as etch mask in the ALE process, portions of the third layer 140 uncovered by spacer masks M2 is thinned and removed by the ALE process, and portions of the third layer 140 covered by the spacer masks M2 is protected from being etched. The portions of the third layer 140 covered by the spacer masks M2 may be referred to as third layers 142 hereinafter. After the ALE process, the top surface of the second layer 130 may be exposed as illustrated in FIG. 14.

Figure 15:
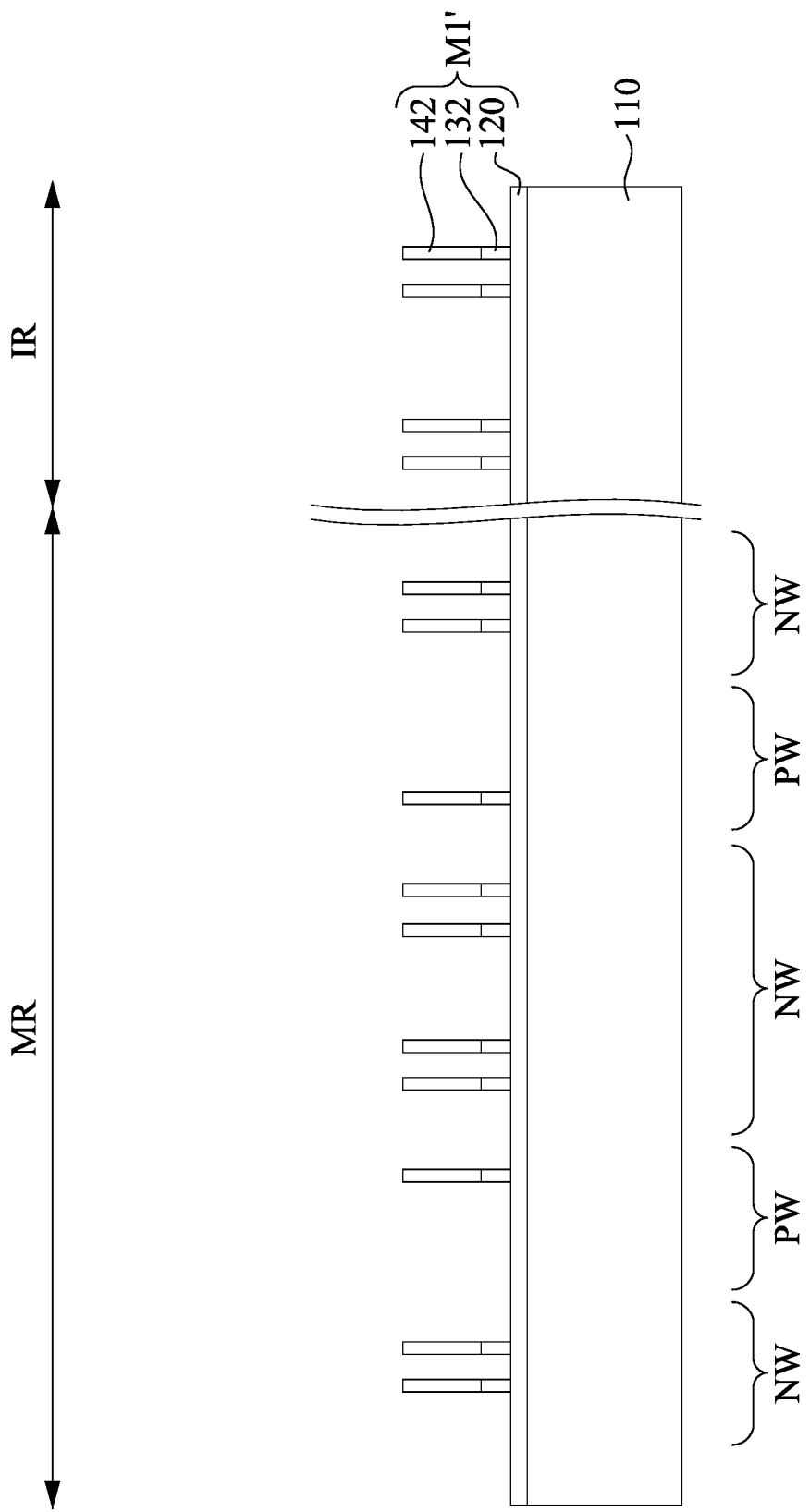

Reference is made to FIG. 15. An etching process is performed to pattern the second layer 130 (referring to FIG. 14) into plural second layers 132. The etching process may use suitable etchants that show etch selectivity between the third layers 142 and the second layer 130 (referring to FIG. 14), and show etch selectively between the second layer 130 (referring to FIG. 14) and the first layer 120. For example, the etching process may be a dry anisotropic etch process, which may CHF chemical as gas etchants, such as $CF_4$, $CH_2F_2$, $CH_3F$, $CHF_3$, the like, or the combination thereof. In other words, the third layers 142 and the first layer 120 have a higher etch resistance than that of the second layer 130 (referring to FIG. 14). Through the configuration, in the etching process, the third layers 142 may serve as etch masks, and the first layer 120 may serve as an etch stop layer. For example, the first layer 120 and the third layers 142 may include silicon oxide, and the second layer 130 (referring to FIG. 14) may include silicon nitride. In some embodiments where the spacer masks M2 (referring to FIG. 14) include silicon nitride, the etching process may consume the spacer masks M2 (referring to FIG. 14). The layers 120, 132, and 142 in combination may be referred to as masks M1'.

Figure 16A:
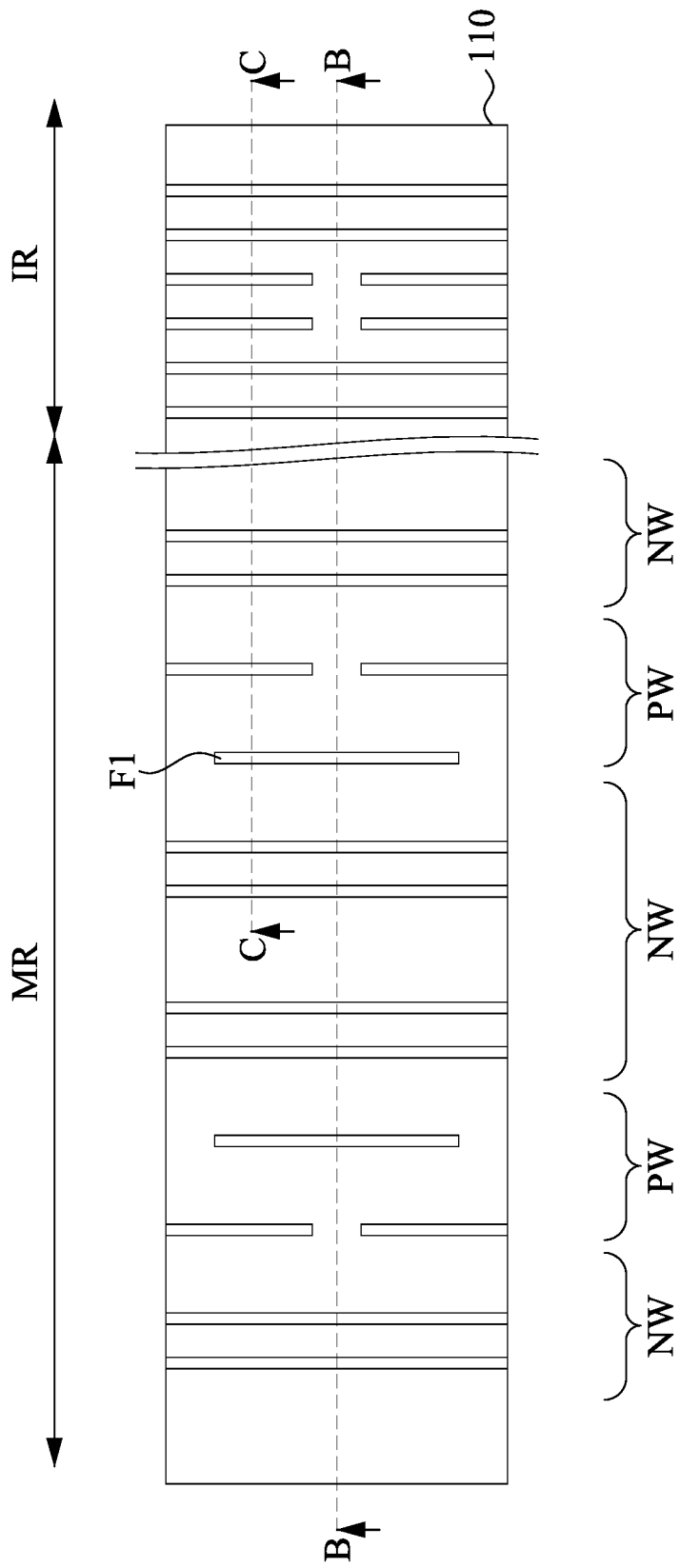
Figure 16B:
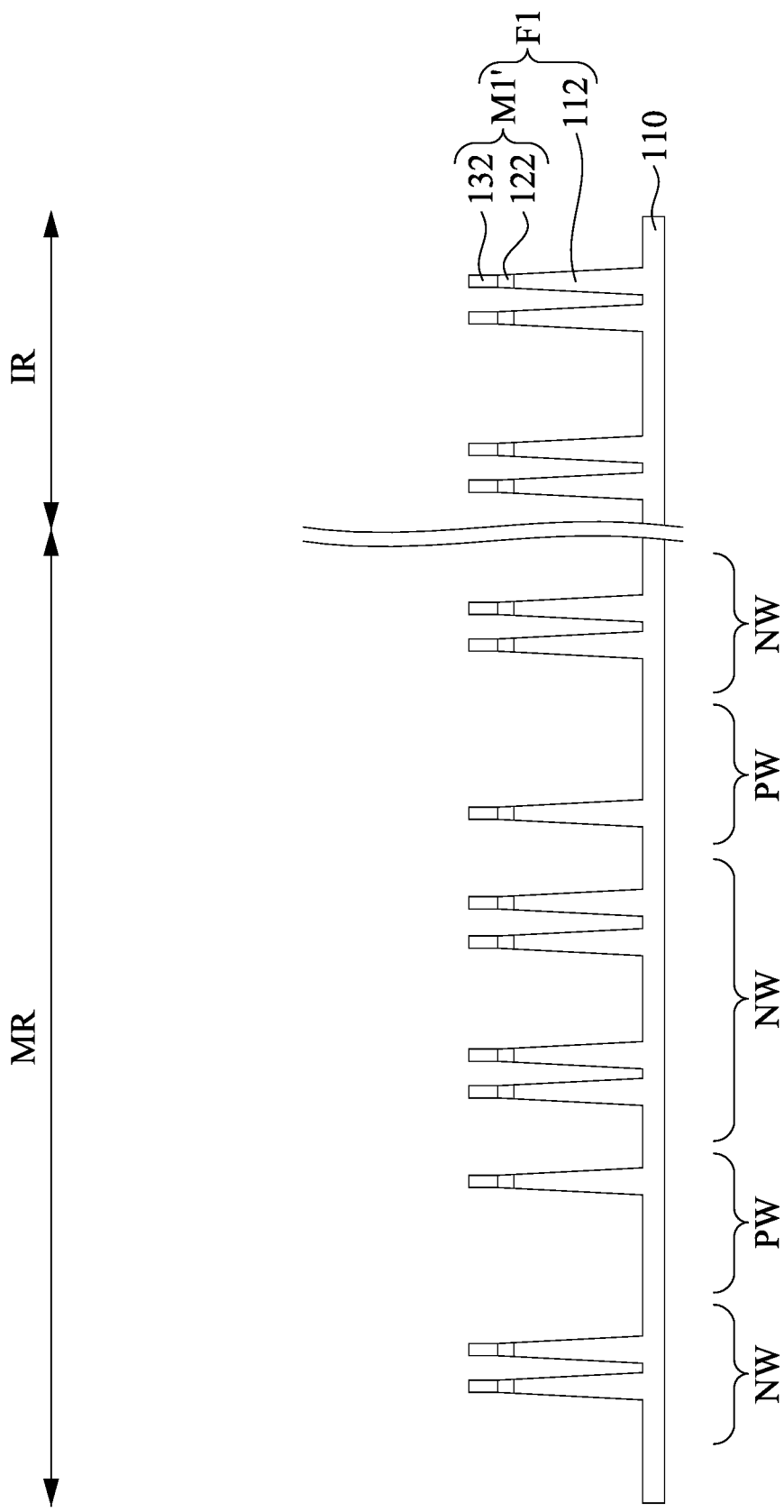

Reference is made to FIGS. 16A and 16B. FIG. 16B is a cross-sectional view taken along line B-B of FIG. 16A. One or more etching processes are performed to pattern the layer 120 into plural layers 122, and patterning the substrate 110 to form plural semiconductor fins 112. The etching process is a dry etching process, a wet etching process, or combinations thereof. The etching process may use suitable etchants that show etch selectivity between the second layers 132 and the first layer 120, and show etch selectively between the second layers 132 and the substrate 110. For example, the etching process may be a dry anisotropic etch process, using gas etchants such as Ar, H2, He, $Cl_2$, $NF_3$, $SF_6$, $CHF_3$, $CH_3F$, the like, or the combination thereof. In other words, the second layers 132 may have a higher etch resistance than that of the first layer 120 (referring to FIG. 11) and that of the substrate 110. Through the configuration, the second layers 132 may serve as etch masks in the etching process. In some embodiments, the etching process may also consume the third layers 142 (referring to FIG. 15).

In some embodiments, the etching process is performed to recess portions of the substrate 110 uncovered by the second layers 132, thereby leaving portions of the substrate 110 covered by the second layers 132 protruding from the recessed portion of substrate 110. The protruding portions of the substrate 110 may form semiconductor fins 112 in an array corresponding to the pattern of the spacer masks M2 in FIG. 9. In the context, for illustration, a semiconductor fins 112 and a corresponding masks M1' may be referred to as a fin F1.

In some cases, as the dimension of FinFet device keep shrinking, some problems from intrinsic physical limitation become serious. For example, the shrinkage of fin CD and fin-fin space may result in lack of etch breakthrough ability during pattern transferring, and therefore fin-fin bridge problem may occur and result in bridge defect in a resulted device. Furthermore, SADP faces challenges from even/odd issue, which is induced when one space MS21 between the spacer masks M2 (referring to FIG. 10) is formed by sacrificial mandrel removal and the space MS22 between the spacer masks M2 (referring to FIG. 10) is formed by the spacer. Considering bridge, even/odd, and CD loading effect problems, the arrangement of cross pattern mandrel sizing for fin-fin space optimization is a subject in fabrication process.

In some embodiments, the width WN of mandrels 152N (referring to FIG. 2B) and the gas etchants, the dose of the etchants in the ALE process (referring to FIGS. 10-14) are chosen for achieving desired etch rates, thereby mitigating the bridge between of the semiconductor fins F1. For example, as illustrated above, in the ALE process (referring to FIGS. 10-14), the etchants and the dose of the etchants are chosen to be a gas mixture of $C_4F_6$ and $O_2$ with a $C_4F_6$ flow in a range of from about 1 sccm to about 20 sccm and a $O_2$ gas flow in a range of from 1 sccm to about 20 sccm. If the provided $C_4F_6$ flow and $O_2$ gas flow are out of the range, bridge issue may become serious. In some embodiments, the width WN of mandrels 152N (referring to FIG. 2B) may be in a range of about 23.5 nanometers to about 24.5 nanometers. If the width WN of mandrels 152N (referring to FIG. 2B) is greater than 24.5, position of fin may shift, which may undesired increase fin to fin space. If the width WN of mandrels 152N (referring to FIG. 2B) is less than 23.5, fin pitch may be too short to induce fin bridge issue.

Figure 16C:
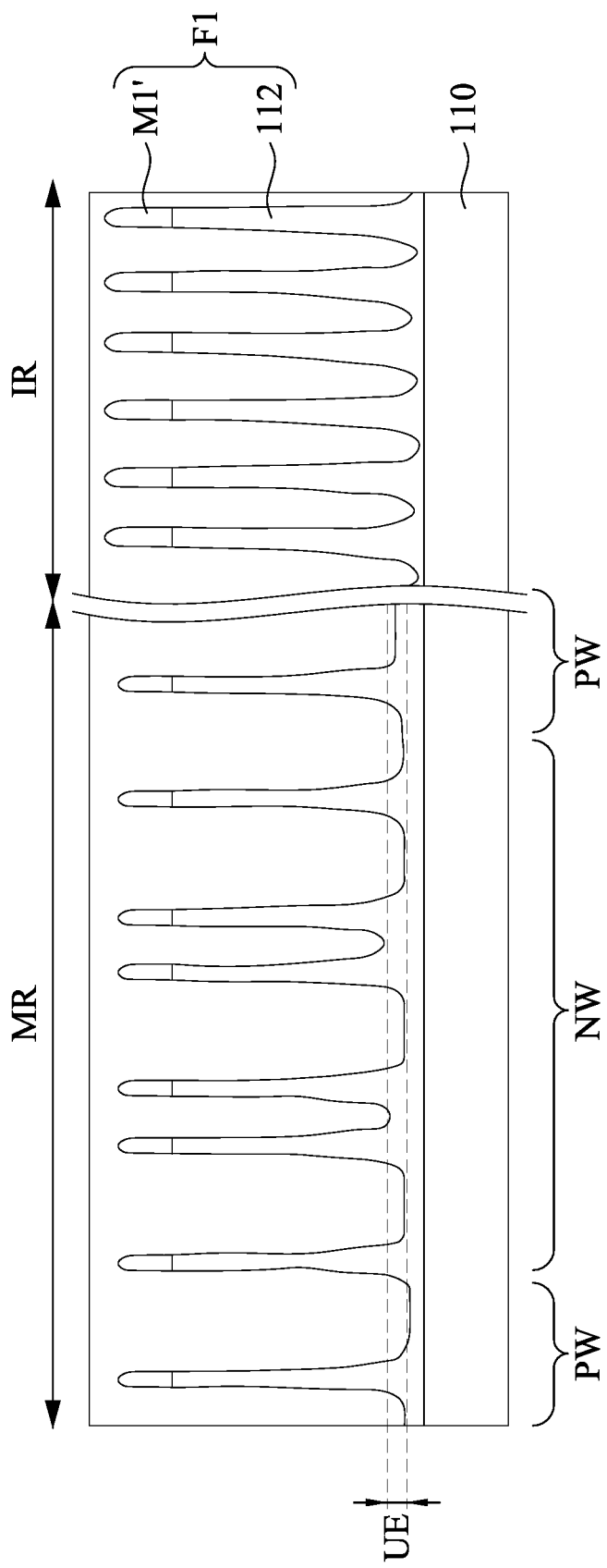

FIG. 16C shows the structures of the formed fins F1. As the figure shows, the formed fins $F_1$ has an undercut UE in a range of about 9 nanometers to about 15 nanometers, and therefore not result in fin bridge, in which fin bridge may occur when the undercut UE is greater than about 20 nanometers. In some embodiments, the undercut UE is referred to as a height difference between the bottom surfaces RS1 of the recesses R1 between the fins F1. The choosing of the width WN of mandrels 152 (referring to FIG. 2B) and the gas etchants, the dose of the etchants in the ALE process (referring to FIGS. 10-14) for mitigating the fin bridge is further detailly illustrated in FIGS. 20-22 later.

Figure 17A:
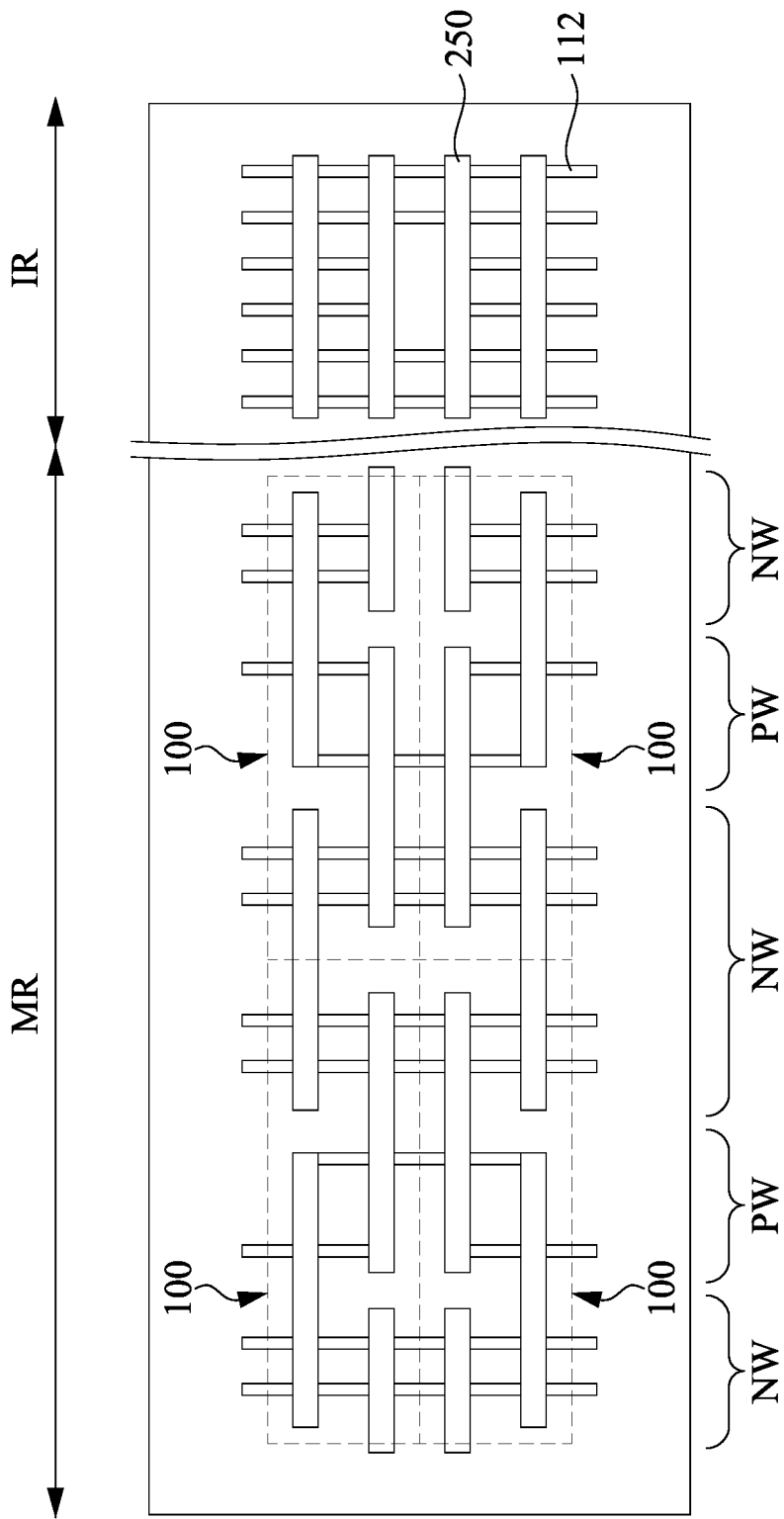
Figure 17B:
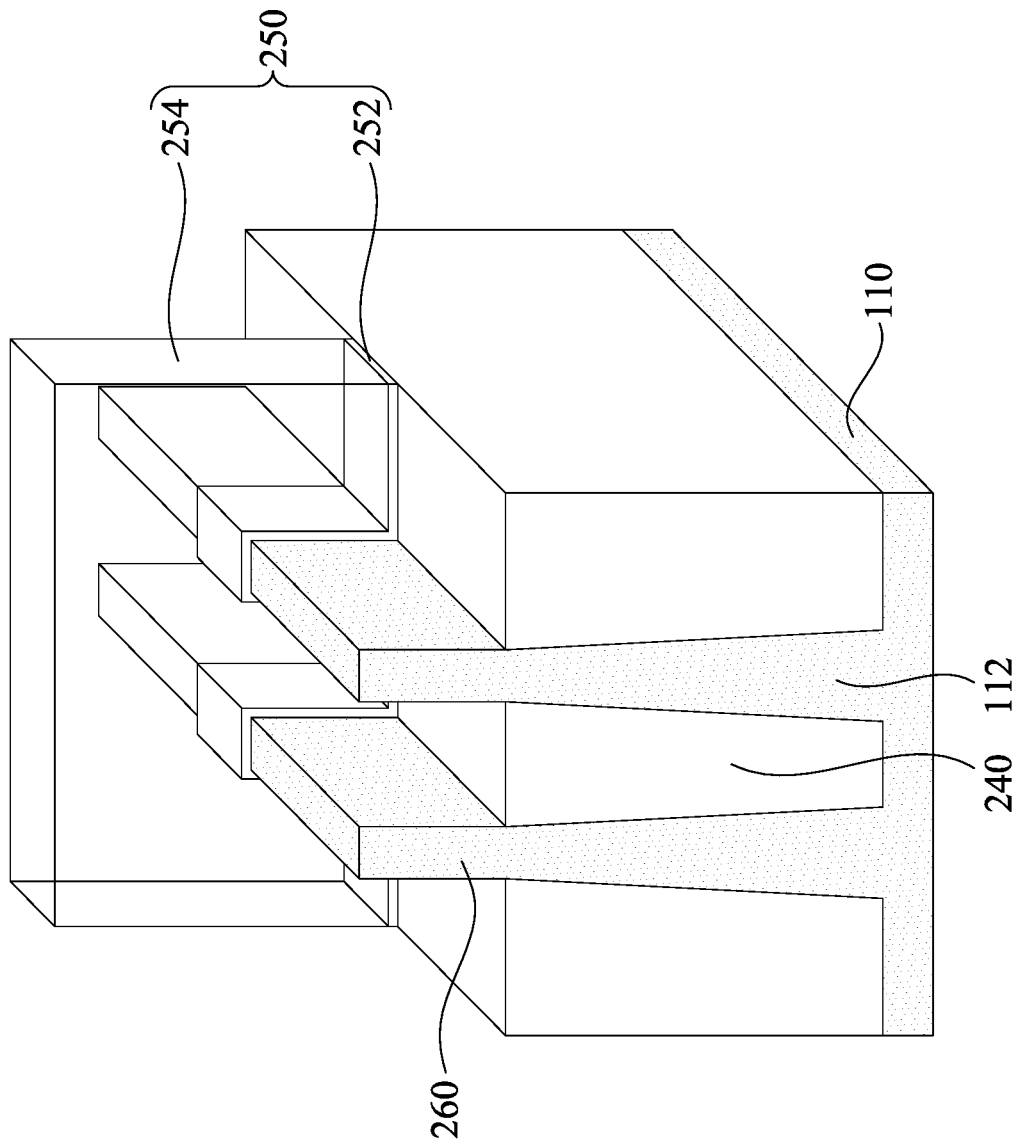

Reference is made to FIGS. 17A and 17B. FIG. 17B illustrates in perspective view of a device of FIG. 17A in accordance with some embodiments of the present disclosure. Isolation features 240 are formed around the semiconductor fins 112, and then the gate structures 250 are formed over the isolation features 240 and the semiconductor fins 112. Subsequently, source/drain regions 260 may be formed on opposite sides of the gate structures 250.

In some embodiments, the isolation features 240 is made of silicon oxide, silicon nitride, silicon oxynitride, fluoride-doped silicate glass (FSG), or other low-K dielectric materials. Formation of the isolation features 240 may include depositing a dielectric material over the structure of FIGS. 16A-16C, followed by planarization process (e.g., chemical mechanical polish (CMP) process), and then recessed by suitable etching method. As a result, semiconductor fins 112 may protrude from top surfaces of the isolation features 240. The isolation features 240 may be referred to as shallow trench isolation (STI) features in some embodiments.

Gate structures 250 are formed over the semiconductor fins 112 for forming various p-type transistor devices and n-type transistor devices. The gate structure 250 may include a gate dielectric layer 252 and a gate electrode layer 254 over the gate dielectric layer 252. The gate dielectric layer 252 may include suitable dielectric material, such as silicon oxide. The gate electrode layer 254 may include suitable conductive material, such as polysilicon or metal. Formation of the gate structure includes depositing a gate dielectric film, followed by depositing a gate electrode film thereon, and then patterning the gate electrode film and the gate dielectric film by suitable etching process to form the gate structure.

In some embodiments, the source/drain regions 260 may be doped region formed in the semiconductor fins 112 using one or more ion implantation processes. In some alternatively embodiments, the source/drain regions 260 may be epitaxial features (e.g., Si features, SiGe features, SiP features) formed using one or more epitaxy or epitaxial (epi) processes. In some embodiments where the gate electrode layer 254 in the gate structure 250 is polysilicon, a gate replacement process may be performed to replace the gate electrode layer 254 with a metal gate layer after the formation of the source/drain regions 260.

Figure 18:
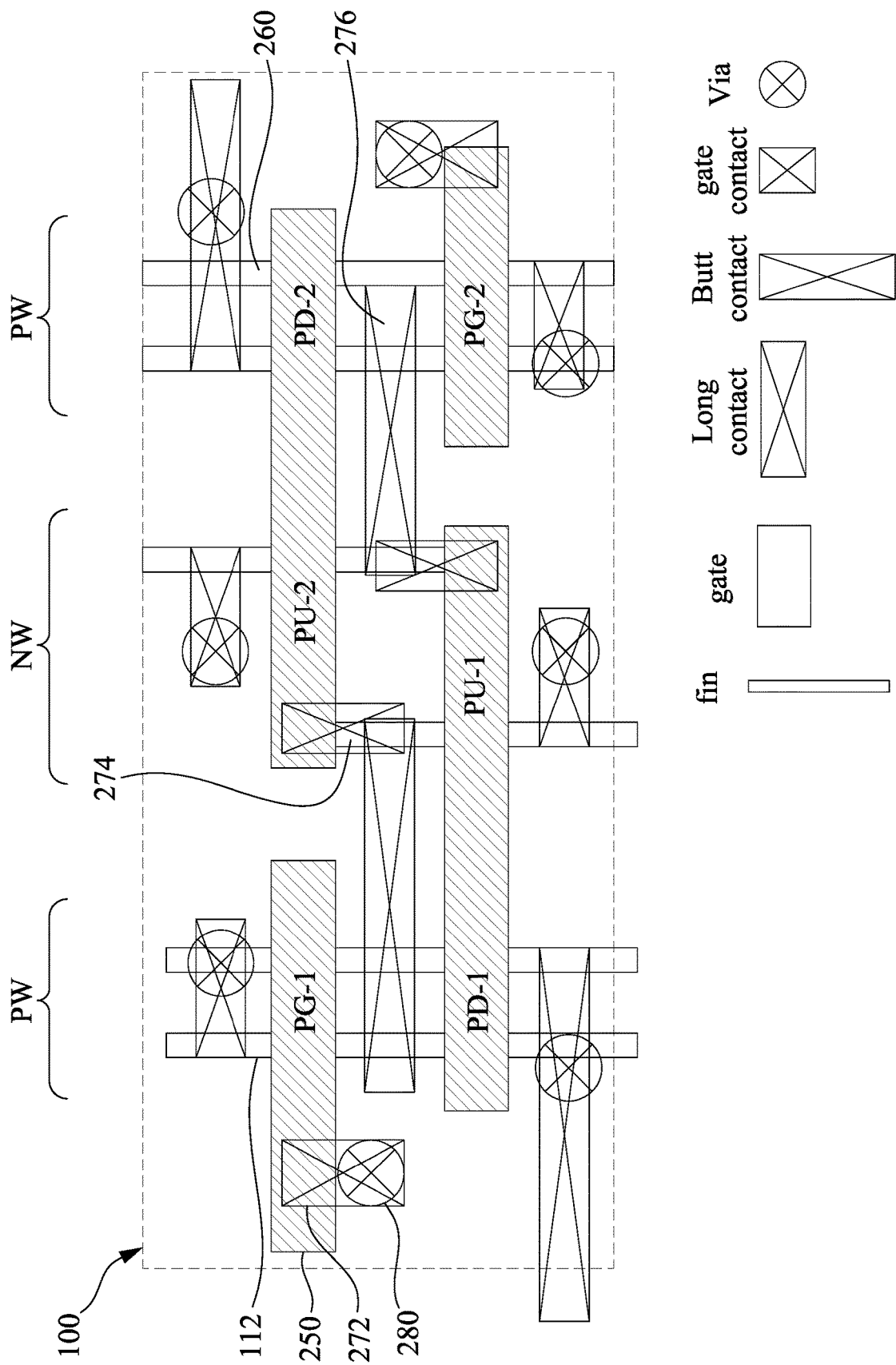

Reference is made to FIG. 18. Gate contacts 272, the butt contacts 274 and the longer contacts 276 are formed over the structure of FIG. 17A, and then vias 280 are formed thereon. In some embodiments, the gate contacts 272, the butt contacts 274 and the longer contacts 276 may be referred to as a metal layer M0 (not shown). While the layout diagram illustrates vias, a first metal layer is not shown for ease of viewing. In some embodiments, the gate contacts 272, the butt contacts 274, and the longer contacts 276 are referred to as local interconnects (LI). As shown in figure, by designing the fins 112 in the n-type well region with suitable pitch without bridge, a contact 276 may be landed on and connected to both two adjacent source/drain regions 260 in the fins 112. The vias 280 on the contacts 276 may connect the source/drain regions 260 in the fins 112 in n-type well region NW to bit line nodes or Vss nodes, the vias 280 on the contacts 276 may connect the source/drain regions 260 in the fins 112 in p-type well region PW to Vdd nodes. In some embodiments, the gate contacts 272, the butt contacts 274, the longer contacts 276, and the vias 280 may be made of suitable metals, such as W, Co, Ru, Al, Cu, or other suitable materials.

Through the process, SRAM cells are formed. In some embodiments, a cell boundary (e.g., the dashed line in FIGS. 17A and 18) defines a unit cell of the SRAM cells 100. Each of the unit cell may include pull-up transistor devices PU-1 and PU-2, pull-down transistor devices PD-1 and PD-2, and pass-gate transistor devices PG-1 and PG-2, in which the transistor devices PU-1 and PU-2 are PMOS transistors, and the transistor devices PD-1, PD-2, PG-1, and PG-2 are NMOS transistors. In some embodiments, the transistor devices PU-1 and PU-2 are single fin transistor devices, and transistor devices PD-1, PD-2, PG-1 and PG-2 are multiple-fin transistor devices.

Figure 19:
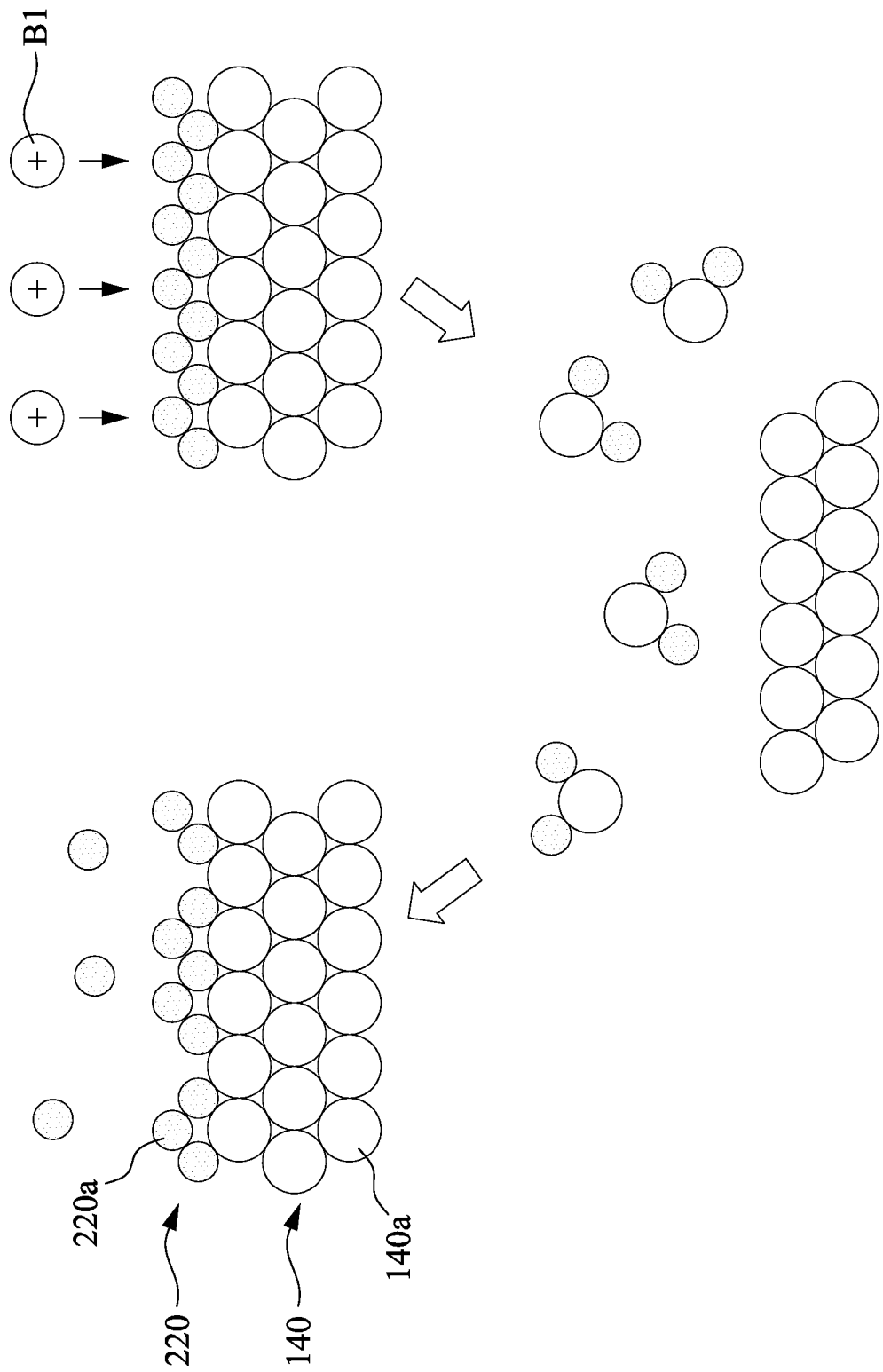
FIG. 19 illustrates an atomic layer etching (ALE) process in accordance with some embodiments of the present disclosure.

FIG. 19 illustrate an atomic layer etch (ALE) process in accordance with some embodiments of the present disclosure. The ALE process includes depositing a conformal etchant material layer 220 on the target material layer (e.g., the third layer 140), and then performing an ion bombardment process. In some embodiments, the etchant material layer 220 include an etchant 220a, such as fluorocarbon, and the target material layer (e.g., the third layer 140) include elements 140a, such as silicon oxide. In some embodiments, the layer thickness of the conformal etchant material layer 220 is adjusted with the etching rate. Next, an ion bombardment process is performed to the material layer M1. In some embodiments, the ion bombardment process is performed by using inert gas ion beam B1 so as to activate the elements 140a that adsorbs the etchant 220a, thereby releasing the elements 140a. In some embodiments, the inert gas used in the inert gas ion beam B1 is selected from He, Ar, Ne, Kr or Xe. In some embodiments, etching parameters, such as a suitable ion energy, etchants, and dose of the etchants are chosen for suitable etching selectivity based on the material (s) of the spacer material layer. Also, a suitable angle for performing the ion bombardment process may be selected based on the fin pitch and/or the fin height of the fins.

Figure 20:
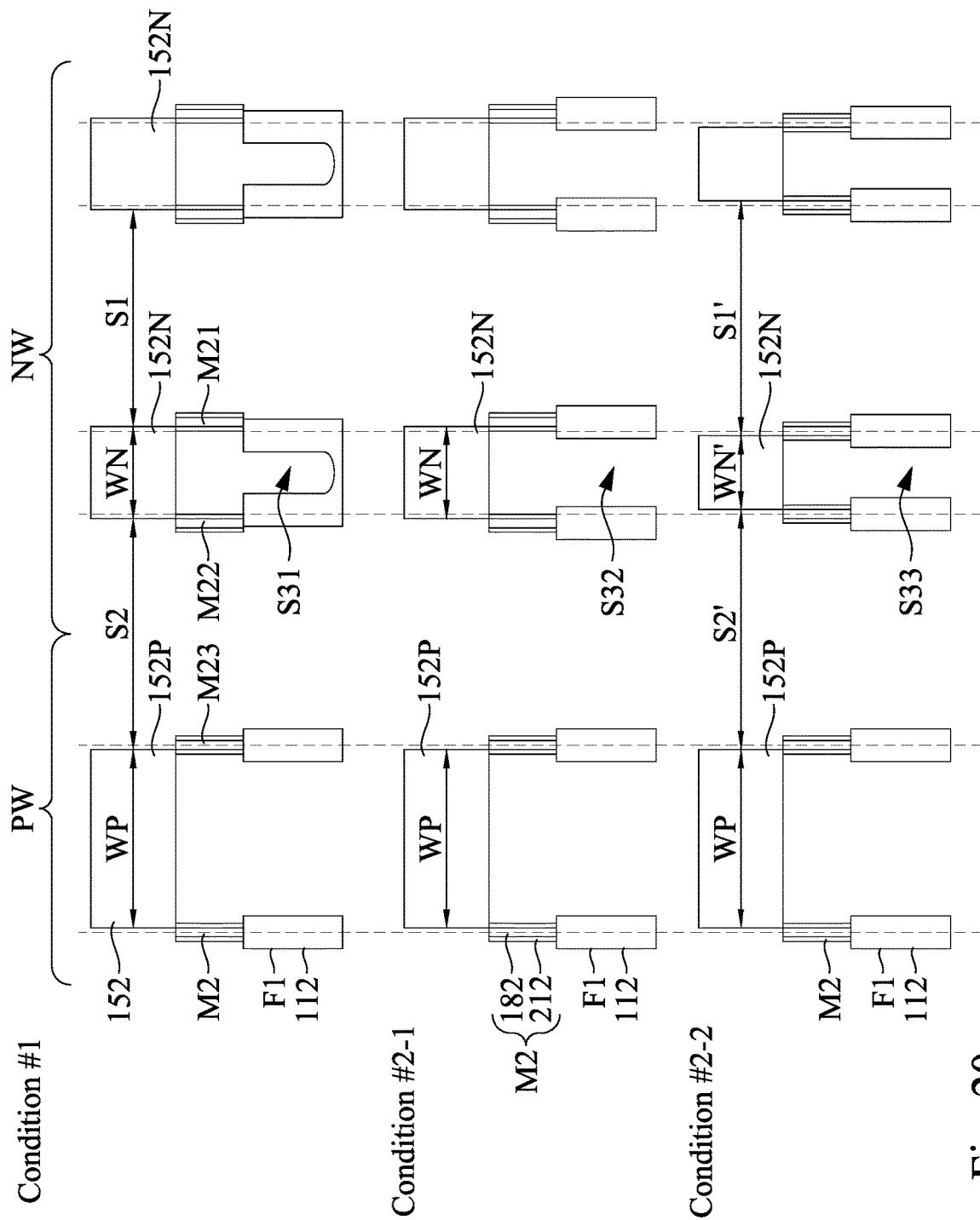
FIG. 20 illustrates a relation between positions of mandrel, spacer mask, and fin under different ALE etching conditions according to some embodiments of the present disclosure.

FIG. 20 illustrates a relation between positions of mandrel, spacer mask, and fin under different ALE etching conditions according to some embodiments of the present disclosure. In some cases, as illustrated in condition #1, in the ALE process (e.g., FIGS. 10-14), etching rates on opposite sides of the spacer masks M2 may be different due to the space loading. For example, in some cases, portions of the third layer 140 (referring to FIGS. 10-14) in the wider space between the spacer masks M22 and M23 receive more deposited etchant material layer 220, and experience high etch rate; and portions of the third layer 140 (referring to FIGS. 10-14) in the narrower space between the spacer masks M21 and M22 receive few deposited etchant material layer 220, and experience much low etch rate. The difference in etch rates may result in bridge between two adjacent third layers 142 in n-type well regions NW (referring to FIG. 15), which may further result in bridge between two adjacent semiconductor fins 112 in n-type regions NW. For example, in condition #1, bridge occurs between two adjacent semiconductor fins 112.

In some embodiments, for addressing the space loading issues, the etchants and the dose of the etchants is further chosen for achieving desired etch rates, thereby mitigating the bridge between of the semiconductor fins 112. For example, in condition #2-1, by chosen suitable etchants and the dose of the etchants, portions of the third layer 140 (referring to FIGS. 10-14) in the narrower space between the spacer masks M21 and M22 receives more deposited etchant material layer 220 than they do in condition #1. Through the design, bridge may not occur between two adjacent semiconductor fins 112 as illustrated in condition #2-1. In some embodiments, in Condition #2-1, the etchants and the dose of the etchants are chosen to be a gas mixture of $C_4F_6$ and $O_2$, in which the $C_4F_6$ may be provided with a flow in a range of from about 1 sccm to about 20 sccm. If the gas mixture is greater than about 20 sccm or lower than about 1 sccm, bridge issue becomes serious. Sometimes, by choosing the etchants and the dose of the etchants, the portions of the third layer 140 in the narrower space between the spacer masks M21 and M22 experiences a faster etch rate than they do in condition #1, thereby resulting in position shift of the formed fins $F_1$. The position shift may undesirably enlarge a fin-to-fin space in the well regions NW, which may further increase the difficulty of contact landing in subsequent process. For example, a fin-to-fin space S32 in condition #2-1 is greater than a fin-to-fin space S31 in condition #1.

In some embodiments of the present disclosure, for addressing the shift issues, widths of the mandrels 152N is reduced as illustrated in condition #2-2. By shrinking the mandrels 152N to the width WN', the space between the spacer masks M21 and M22 is reduced, and a fin-to-fin space S33 between adjacent formed fins F1 (or the fin 112) in condition #2-2 is less than the fin-to-fin space S32 in condition #2-1. For example, for a technology node with a fin width (or fin CD) of about 9 nanometers, the fin-to-fin space S33 may be in a range of about 16 nanometers to about 17 nanometers. The formed semiconductor fin 112 may have a fin width (or fin CD) in the well regions NW may be in a range of about 8.1 nanometers to about 9.1 nanometers, and the formed semiconductor fin 112 may have a fin width (or fin CD) in the well regions PW may be in a range of about 8.2 nanometers to about 9.2 nanometers. In Condition #2-2, the etchants and the dose of the etchants in the ALE process may be substantially as those chosen in Condition #2-1. As a result, by using the chosen etchants and the chosen dose of the etchants, and by reducing the widths of the mandrels 152N, the fins $F_1$ (or the fin 112) may be formed without the bridge and without position shift or enlarging fin-to-fin pitch.

In some embodiments of the present disclosure, in Condition #2-2, the width WN' of mandrels 152N is chosen to be in a range of about 23.5 nanometers to about 24.5 nanometers, the width WP of mandrels 152P may be in a range of about 50 nanometers to about 52 nanometers. In addition, a space/distance S1' between adjacent two mandrels 152N may be in a range of about 61 nanometers to about 66 nanometers, and a space/distance S2' between adjacent two mandrels 152N and 152P may be in a range of about 61 nanometers to about 66 nanometers. In some embodiments, spaces between adjacent two mandrels 152N are expanded more than the spaces between adjacent two mandrels 152N and 152P. For example, comparing to condition #1, assumed that the space/distances S1 and S2 in condition #1 are substantially the same, the space/distance S1' in condition #2-2 may be greater than the space/distance S2'. By fabricating the device with these parameters, central line of the fins F1 may remain at substantially the same location without position shift (e.g., compare to the condition #1), and fin pitch (e.g., fin-to-fin space S33) may meet the design of SRAM cell without fin bridge.

Figure 21:
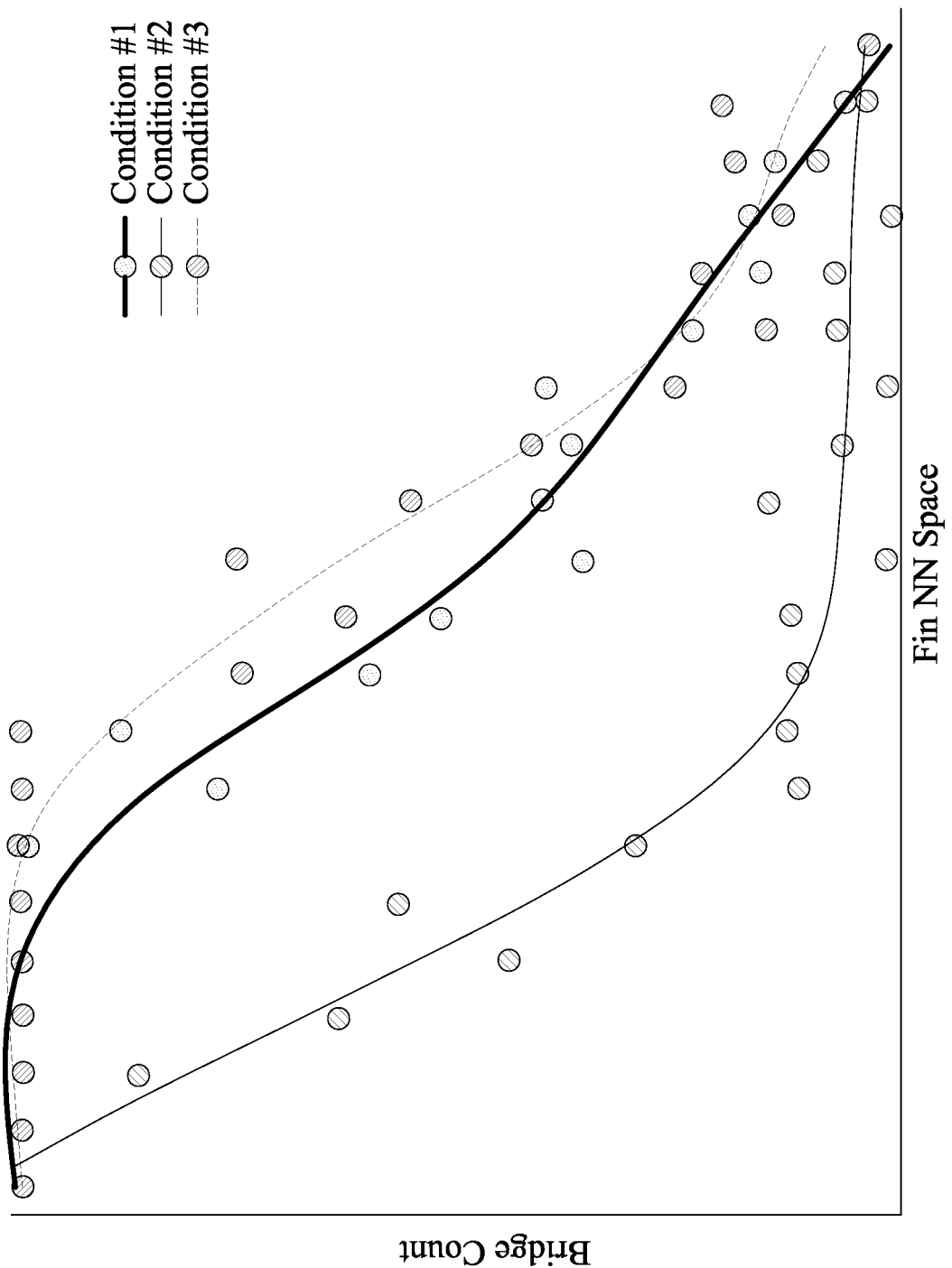
FIG. 21 is a graph illustrating experimental results showing fin space versus bridge count in different etching conditions according to some embodiments of the present disclosure.

For example, FIG. 21 is a graph illustrating experimental results showing fin space versus bridge count in different etching conditions in the ALE process (referring to FIGS.

10-14 and FIG. 18) according to some embodiments of the present disclosure. In FIG. 21, the fin space is shown on the horizontal axis, and the bridge count is shown on the vertical axis. In some embodiments, these etching conditions are different in their dose of the gas etchant. For example, in some embodiments where the gas etchants include $C_4F_6/O_2$, these etching conditions are different in their $C_4F_6$ flow and $O_2$ flow. To be specific, the $C_4F_6$ flow and the $O_2$ flow in Condition #2 are greater than the $C_4F_6$ flow and the $O_2$ flow in Condition #1, and less than the $C_4F_6$ flow and the $O_2$ flow in Condition #3.

As the figure shows, in Condition #1 and Condition #3, by shrinking the fin space (i.e., NN space), the bridge count is considerably increased. Comparing with the Condition #1 and Condition #3, in Condition #2, by shrinking the NN space, the bridge count is not obviously increased until the NN space is lower than a certain value. Furthermore, the bridge count in Condition #2 is less than that in Condition #1 or Condition #3. As a result, for preventing the bridge between of the semiconductor fins 112 (referring to FIGS. 16A-16C), the etching conditions in Condition #2 may be selected. The Condition #2-1 and Condition #2-2 in FIG. 20 may be performed with the etching conditions in Condition #2 in FIG. 21, and the Condition #1 in FIG. 20 may be performed with the etching conditions in Condition #1 in FIG. 21.

Figure 22:
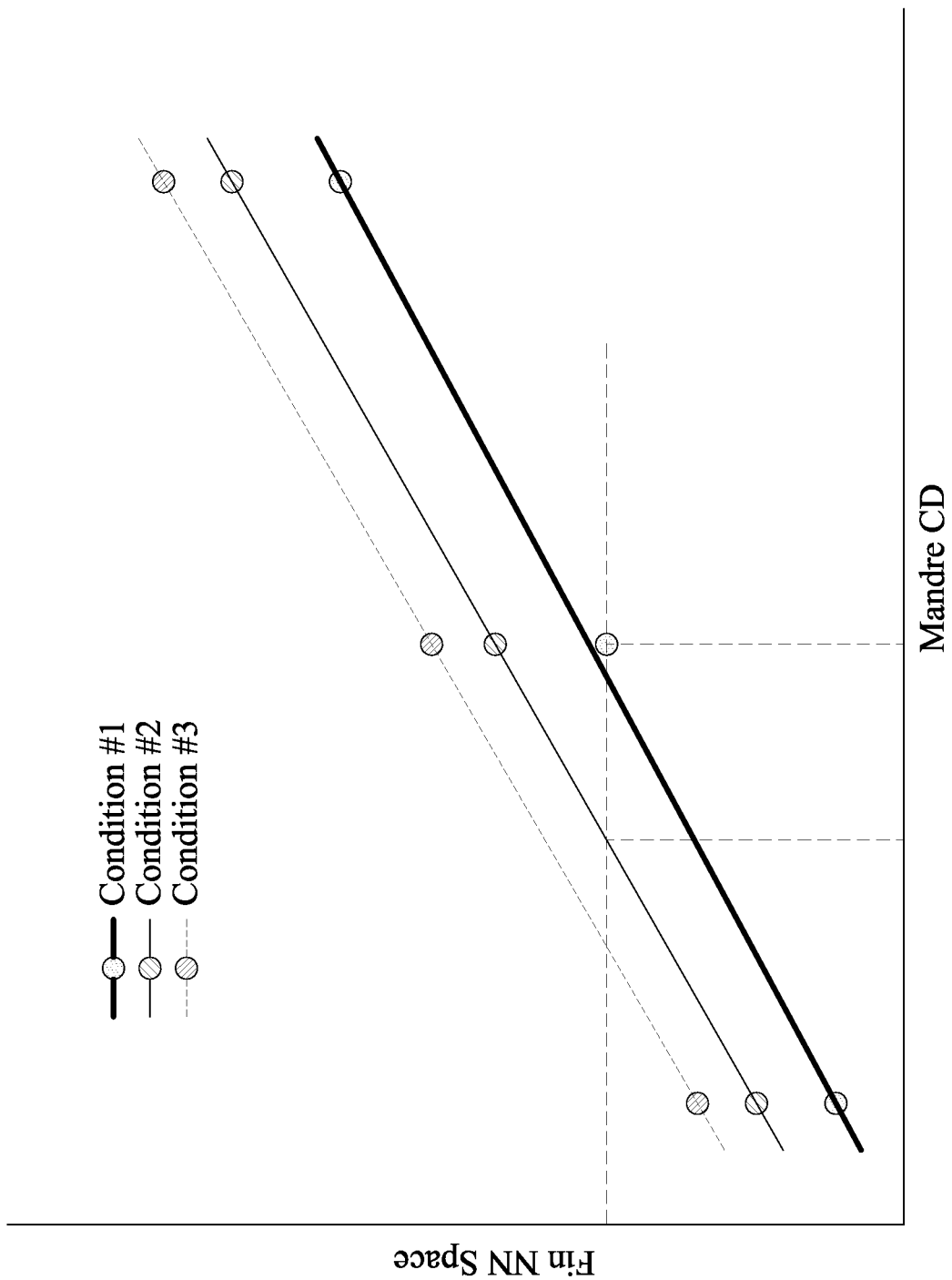
FIG. 22 is a graph illustrating experimental results showing mandrel CD versus fin space in different etching conditions according to some embodiments of the present disclosure.

FIG. 22 is a graph illustrating experimental results showing mandrel CD versus fin space in different etching conditions according to some embodiments of the present disclosure. In FIG. 22, the mandrel CD is shown on the horizontal axis, and the fin space is shown on the vertical axis. In some embodiments, these etching conditions are different in their dose of the gas etchant. For example, in some embodiments where the gas etchants include $C_4F_6/O_2$, these etching conditions are different in their $C_4F_6$ flow and $O_2$ flow. For example, as aforementioned, the $C_4F_6$ flow and the $O_2$ flow in Condition #2 are greater than the $C_4F_6$ flow and the $O_2$ flow in Condition #1, and less than the $C_4F_6$ flow and the $O_2$ flow in Condition #3.

In these conditions, by shrinking the mandrels 152, the fin space is reduced. While the Condition #1 and Condition #3 may result in fin bridge (as illustrated in FIG. 20), the Condition #1 may be chosen, and the mandrel CD is reduced for obtaining desired fin pitch.

Figure 23:
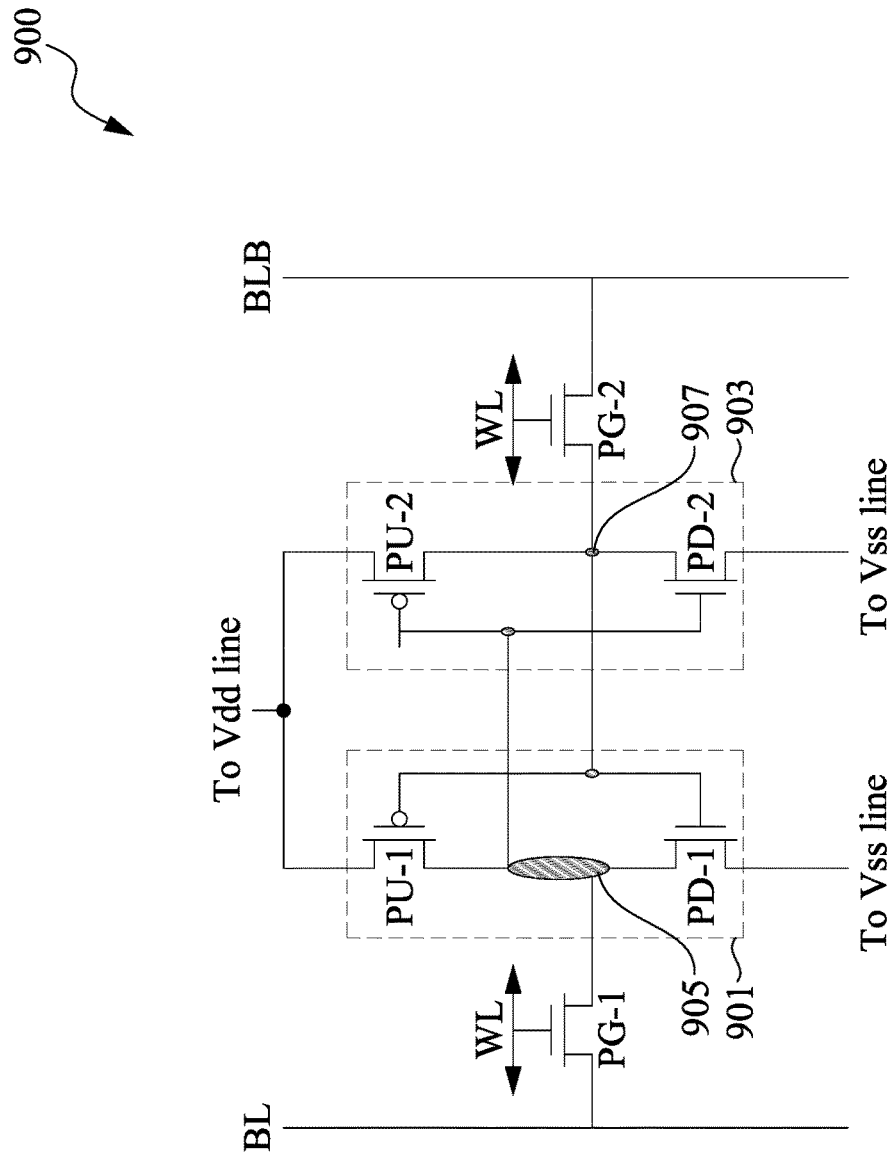
FIG. 23 is a circuit diagram of a six transistor (6T) SRAM cell according to some embodiments of the present disclosure.

FIG. 23 is a circuit diagram of a six transistor (6T) SRAM cell 900 according to some embodiments of the present disclosure. SRAM is a type of volatile semiconductor memory that uses bistable latching circuitry to store each bit. Each bit in an SRAM cell 900 is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. The SRAM cell 900 comprises a first inverter 901 formed by a pull-up p-type metal oxide semiconductor (PMOS) transistor PU-1 and a pull-down n-type metal oxide semiconductor (NMOS) transistor PD-1. The SRAM cell 900 further comprises a second inverter 903 formed by a pull-up PMOS transistor PU-2 and a pull-down NMOS transistor PD-2. Furthermore, both the first inverter and second inverter are coupled between a voltage bus Vdd and a ground potential Vss.

In some embodiments, the first inverter 901 and the second inverter 903 are cross-coupled. That is, the first inverter 901 has an input connected to the output of the second inverter 903. Likewise, the second inverter 903 has an input connected to the output of the first inverter 901. The output of the first inverter is referred to as a storage node 905. Likewise, the output of the second inverter is referred to as a storage node 907. In a normal operating mode, the storage node 905 is in the opposite logic state as the storage node 907. By employing the two cross-coupled inverters, the SRAM cell 900 can hold the data using a latched structure so that the stored data will not be lost without applying a refresh cycle as long as power is supplied through Vdd.

In an SRAM array using the 6T SRAM cells, the cells are arranged in rows and columns. The columns of the SRAM array are formed by a bit line pairs, namely a first bit line BL and a second bit line BLB. The cells of the SRAM array are disposed between the respective bit line pairs. As shown in FIG. 23, the SRAM cell 900 is placed between the bit line BL and the bit line BLB.

As shown in FIG. 23, the SRAM cell 900 further comprises a first pass-gate transistor PG-1 connected between the bit line BL and the output 905 of the first inverter. The SRAM cell 900 further comprises a second pass-gate transistor PG-2 connected between the bit line BLB and the output 907 of the second inverter. The gates of the first pass-gate transistor PG-1 and the second pass-gate transistor PG-2 are connected to a word line (WL), which connects SRAM cells in a row of the SRAM array.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, masks using for fin patterning may be patterned from a material layer by ALE process, which is advantageous for etching the material layer exposed by limited space as the dimension of device keep shrinking. The ALE process is advantage for its depth/space ratio and etch selectivity. Another advantage is that by tuning ALE parameters and sizes of mandrels, a method of small fin-fin space etch enhancement and cross-pattern mandrel CD optimization is provided for fin-fin bridge reduction. Still another advantage is that, through fin-fin bridge defect reduction, better device performance and wider process window can be achieved.

According to some embodiments of the present disclosure, a method for manufacturing a semiconductor device is provided. The method includes forming a material layer over a semiconductor substrate; forming a plurality of spacer masks over the material layer; patterning the material layer into a plurality of masks below the spacer masks, wherein patterning the material layer comprises an atomic layer etching (ALE) process; and etching the semiconductor substrate through the masks.

According to some embodiments of the present disclosure, a method for manufacturing a semiconductor device is provided. The method includes forming a n-type well region and a p-type well region in a semiconductor substrate; forming a material layer over the semiconductor substrate; forming a first mandrel and a second mandrel over the material layer, wherein the first and second mandrels are respectively over the n-type well region and the p-type well region, and a width of the first mandrel is less than a width of the second mandrel; forming first spacer masks on opposite sidewalls of the first mandrel and second masks on opposite sidewalls of the second mandrel; patterning the material layer into a plurality of masks; and etching the semiconductor substrate to form a plurality of semiconductor fins.

According to some embodiments of the present disclosure, a method for manufacturing a semiconductor device is provided. The method includes forming a first mandrel, a second mandrel, and a third mandrel over a semiconductor substrate, wherein the second mandrel is between the first mandrel and the third mandrel, and the third mandrel has a width greater than a width of the first mandrel and a width of the second mandrel; depositing a first spacer layer over the first to third mandrels and the semiconductor substrate; and patterning the first spacer layer into a plurality of first spacers on opposite sidewalls of the first to third mandrels forming a plurality of second spacers on opposite sidewalls of the first spacers; and etching the semiconductor substrate to form a plurality of semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a material layer over a semiconductor substrate;
    forming a plurality of spacer masks over the material layer;
    patterning the material layer into a plurality of masks below the spacer masks, wherein patterning the material layer comprises an atomic layer etching (ALE) process, wherein the ALE process comprises a plurality of cycles, and each of the cycles comprises:
        depositing an etchant material layer over the material layer and the spacer masks by using a mixture of a fluoride-containing gas and an oxide-containing gas, such that a surface layer of the material layer adsorbs elements of the etchant material layer; and
        bombarding the surface layer of the material layer after depositing the etchant material layer; and
    etching the semiconductor substrate through the masks.

2. The method of claim 1, wherein the fluoride-containing gas is $C_4F_6$, and the oxide-containing gas is $O_2$.

3. The method of claim 1, further comprises:
    forming an etch stop layer over the semiconductor substrate prior to forming the material layer, wherein the etch stop layer has a higher etch resistance to the ALE process than that of the material layer.

4. The method of claim 1, wherein the spacer masks have a higher etch resistance to the ALE process than that of the material layer.

5. The method of claim 1, wherein forming the spacer masks comprises:
    forming a plurality of mandrels over the semiconductor substrate;
    depositing a first spacer layer over the mandrels and the semiconductor substrate; and
    patterning the first spacer layer into a plurality of first spacers on opposite sidewalls of the mandrels.

6. The method of claim 5, wherein forming the spacer masks further comprises:
    removing the mandrels from the semiconductor substrate.

7. The method of claim 5, wherein forming the spacer masks further comprises:
    depositing a second spacer layer over the first spacers; and
    patterning the second spacer layer into a plurality of second spacers on opposite sidewalls of the first spacers.

8. The method of claim 1, wherein depositing the etchant material layer is performed such that the etchant material layer is in contact with opposite sidewalls of one of the spacer masks.

9. The method of claim 1, wherein the material layer is a silicon oxide layer.

10. A method for manufacturing a semiconductor device, comprising:
    forming a material layer over a semiconductor substrate;
    forming a spacer mask over the material layer, wherein the material layer has a first portion covered the spacer mask and a second portion uncovered by the spacer mask, wherein forming the spacer mask comprises:
    forming a mandrel over the material layer;
    depositing a spacer layer over the mandrel and the material layer;
    etching the spacer layer into the spacer mask on a sidewall of the mandrel; and
    removing the mandrel from the material layer;
    depositing a first fluorocarbon layer over the material layer and the spacer mask, wherein the second portion of the material layer has a first surface layer in contact with the first fluorocarbon layer;
    removing the first surface layer of the second portion of the material layer from the material layer;
    after removing the first surface layer of the second portion of the material layer, depositing a second fluorocarbon layer over the material layer and the spacer mask, wherein the second portion of the material layer has a second surface layer in contact with the second fluorocarbon layer;
    removing the second surface layer of the second portion of the material layer from the material layer; and
    after removing the second surface layer of the second portion of the material layer, etching the semiconductor substrate through the material layer.

11. The method of claim 10, wherein a top surface of the second portion of the material layer is lower than a top surface of the first portion of the material layer after removing the first surface layer of the second portion of the material layer.

12. The method of claim 10, wherein depositing the first fluorocarbon layer and depositing the second fluorocarbon layer are performed in a same chamber.

13. The method of claim 10, wherein depositing the first fluorocarbon layer is performed such that a thickness of the first fluorocarbon layer is less than a height of the spacer mask.

14. The method of claim 10, wherein forming the mandrel is performed such that the mandrel covers the second portion of the material layer.

15. A method for manufacturing a semiconductor device, comprising:
    forming a material layer over a semiconductor substrate;
    forming a spacer mask over the material layer, wherein the material layer has a first portion covered the spacer mask and a second portion uncovered by the spacer mask;
    performing a plurality of ALE cycles, each of the ALE cycles comprising:
        conformally depositing an etchant material layer over the material layer and the spacer mask; and bombarding the material layer after conformally depositing the etchant material layer; and after the ALE cycles, etching the semiconductor substrate through the material layer.

16. The method of claim 15, wherein conformally depositing the etchant material layer and bombarding the material layer are performed in a same chamber.

17. The method of claim 16, wherein each of the ALE cycles further comprises:

purging the chamber after conformally depositing the etchant material layer and prior to bombarding the material layer.

18. The method of claim 16, wherein each of the ALE cycles further comprises:

purging the chamber after bombarding the material layer.

19. The method of claim 15, wherein conformally depositing the etchant material layer is performed with a first time duration, and bombarding the material layer is performed with a second time duration longer than the first time duration.

20. The method of claim 15, wherein conformally depositing the etchant material layer is performed with a first bias power, and bombarding the material layer is performed with a second bias power greater than the first bias power.

* * * * *